United States Patent [19]
Cloud et al.

[11] Patent Number: 6,119,251
[45] Date of Patent: Sep. 12, 2000

[54] SELF-TEST OF A MEMORY DEVICE

[75] Inventors: Eugene H. Cloud; Leland R. Nevill; Ray J. Beffa, all of Boise; Warren M. Farnworth, Nampa, all of Id.

[73] Assignee: Micron Technology, Inc., Boise, Id.

[21] Appl. No.: 09/127,043

[22] Filed: Jul. 31, 1998

Related U.S. Application Data

[63] Continuation-in-part of application No. 08/838,010, Apr. 22, 1997.

[51] Int. Cl.[7] .................................................... G01R 31/28
[52] U.S. Cl. ............................................ 714/718; 365/201
[58] Field of Search .................................... 714/718, 719, 714/733, 735, 744, 819; 365/201

[56] References Cited

U.S. PATENT DOCUMENTS

| | | | |
|---|---|---|---|
| 4,875,210 | 10/1989 | Russo et al. ............................. | 714/738 |
| 5,515,323 | 5/1996 | Yamazaki et al. ............. | 365/189.05 X |
| 5,606,370 | 2/1997 | Moon ..................................... | 348/390 |

FOREIGN PATENT DOCUMENTS 0786772   7/1997   European Pat. Off. .

*Primary Examiner*—Hoa T. Nguyen
*Attorney, Agent, or Firm*—Dickstein Shapiro Morin & Oshinsky, LLP

[57] ABSTRACT

DRAM self-test circuitry performs an on-chip test of a DRAM memory array. The self-test circuitry writes either all ones or all zeroes to each set of physical rows having the same address within the segment to be tested, and then reads the rows a set at a time. If the data bits comprising the set do not all equal one or zero, a resultant error detection signal is generated and used to latch the failed addresses into a failed address queue. If the data bits are either all zeros or ones, the next set of rows are tested. In another embodiment, the self-test circuitry also includes a mechanism for determining the performance of the addressed memory with respect to speed as well as accuracy. When either self-test is complete, the failed addresses stored in the queue may be transmitted to an external, off-chip device or analyzed and acted on by on-chip error correction circuitry. The self-test circuitry further includes circuitry to detect data bit transitions between successive failing addresses latched in a the address queue. If the transition circuitry determines that one or more bits have the same logic in all of the failed addresses, a partialing technique may be employed to repair DRAMs that have more failing rows/columns than redundant rows/columns.

68 Claims, 16 Drawing Sheets

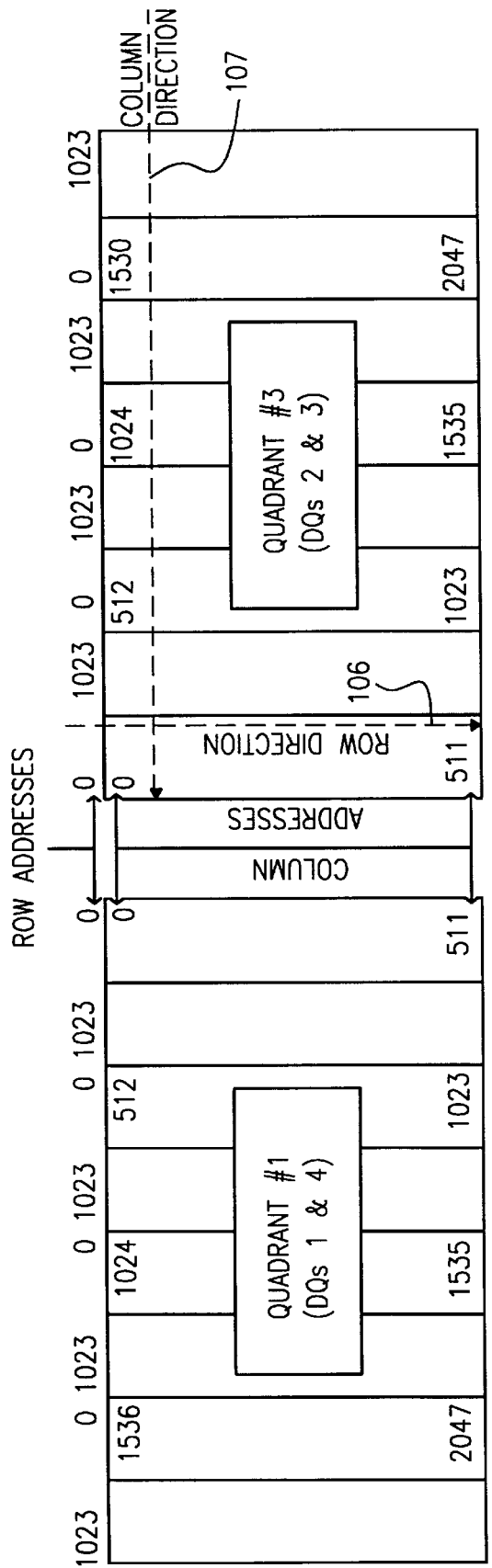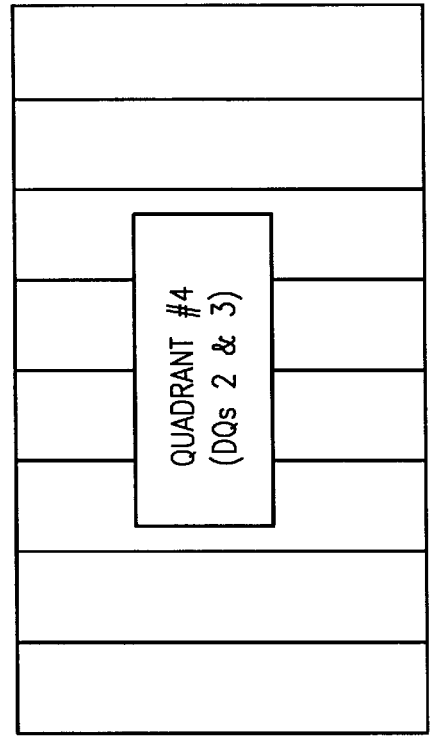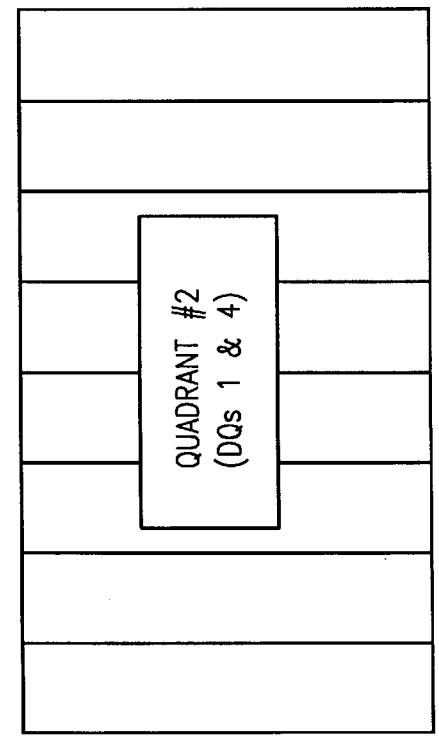
FIG. 1  4 MEG x 4 -- F.A. ARRAY MAP

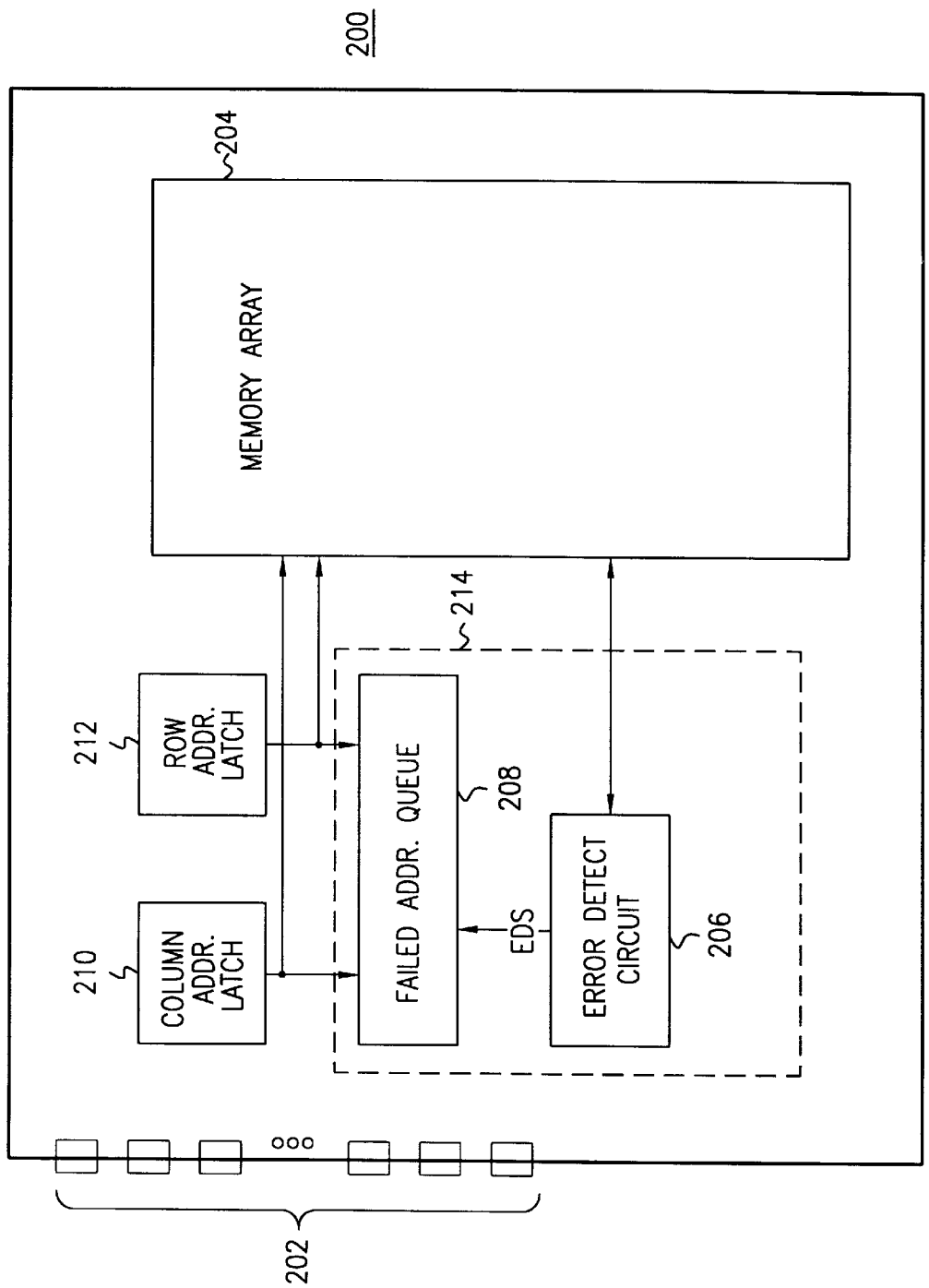

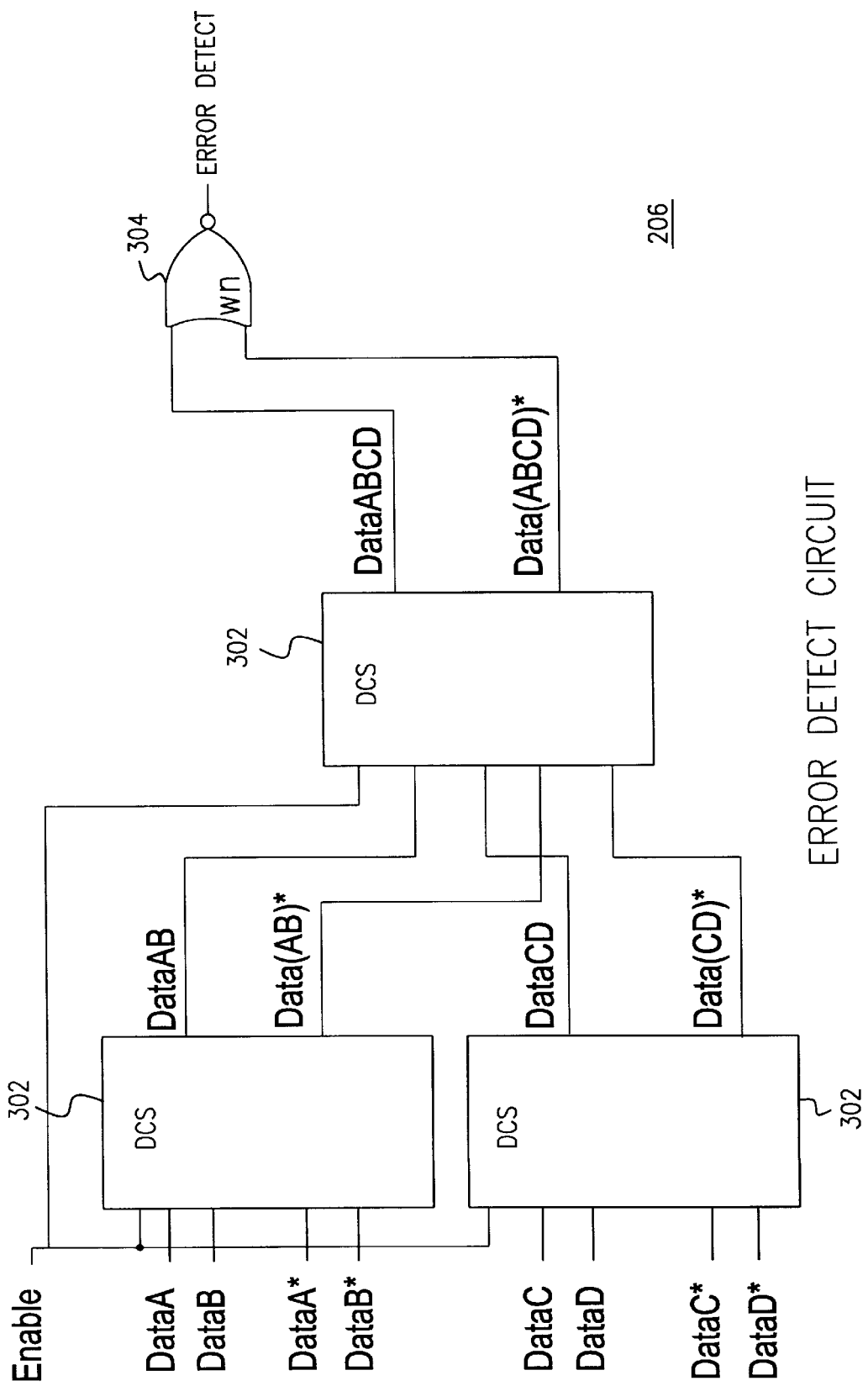

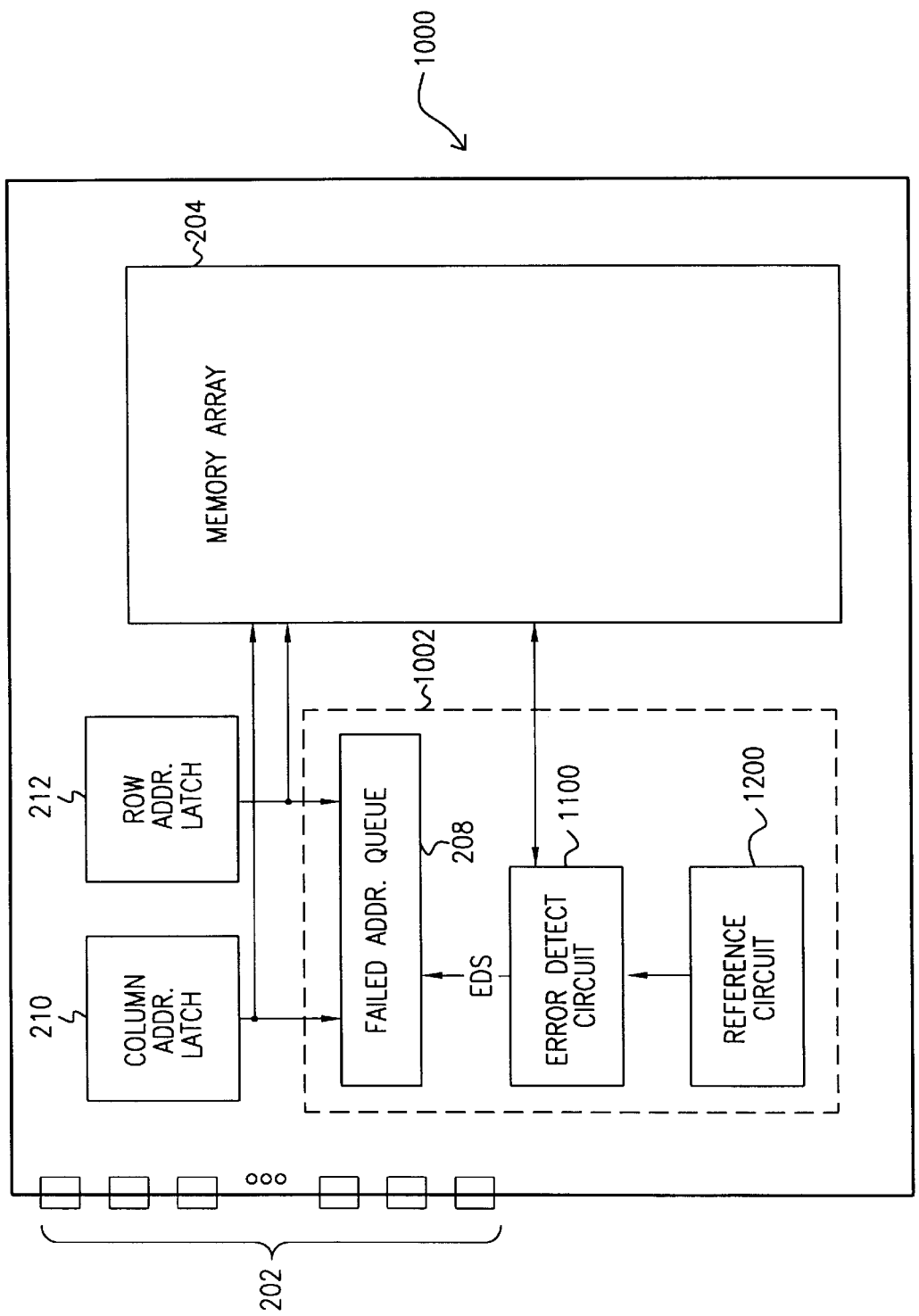

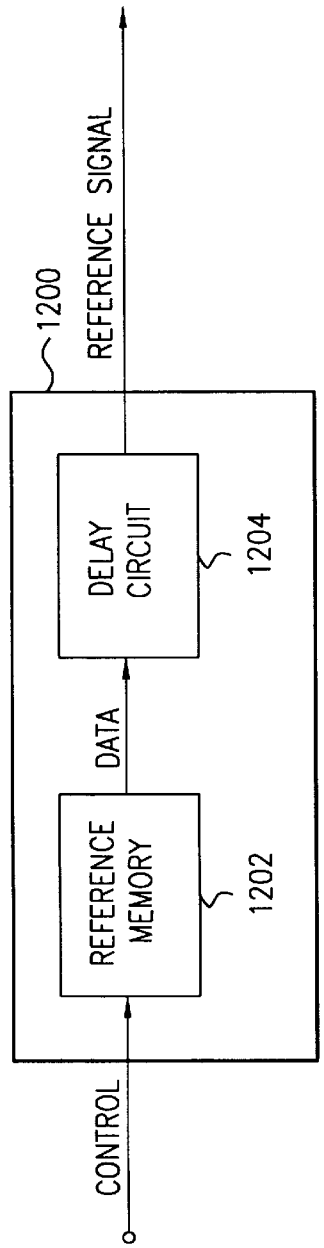
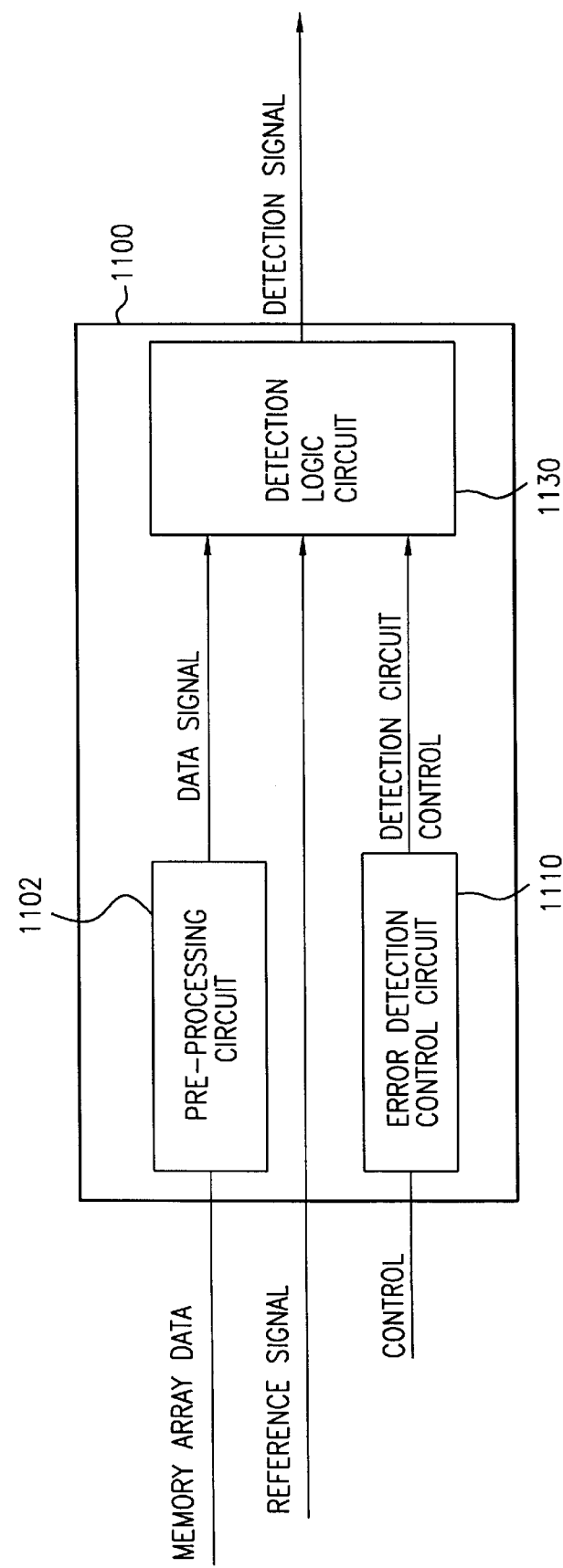

ERROR DETECTION CONTROL CIRCUIT

DETECTION LOGIC CIRCUIT

SELF-TEST OF A MEMORY DEVICE

RELATED APPLICATIONS

This application is a continuation-in-part of application Ser. No. 08/838,010 filed on Apr. 22, 1997, which is hereby incorporated by reference. This disclosure is related to application Ser. No. 08/837,820 filed on Apr. 22, 1997, the contents of which are hereby incorporated by reference.

BACKGROUND OF THE INVENTION

The present disclosure relates generally to the computer memory field, and more particularly, to on-chip testing of dynamic random access memory (DRAM) semiconductor chips.

A DRAM memory cell (memory bit) is a binary memory element formed with one transistor and one capacitor. A modern DRAM memory unit may contain many millions of addressable memory cells. Each cell's capacitor holds binary information in the form of charge, and the cell's transistor operates as a switch to introduce and control the charge stored on the capacitor.

The memory cells are organized into arrays. To access a particular memory cell when performing a read operation, the operator supplies the DRAM with the address of the cell to be accessed. The DRAM translates the address into a row address and a column address of the array the memory cell is located in, and the addressed column and row are then accessed and the charge stored on the memory cell capacitor at the intersection of the addressed column and row is sensed.

FIG. 1 is a diagram showing a memory cell array map for a 4 Meg×4 DRAM (i.e., a DRAM with sixteen million total bits, accessible in four million, four-bit units). Array maps for other size DRAMs are similar in content. The DRAM is divided into four quadrants, each made up of a series of rows, such as row 106, and columns, such as column 107. The rows in quadrants one and three have addresses extending from zero to 1023, and are accessed four at a time. That is, because each row address in a quadrant is repeated four times, access to any row address drives four physical rows in the accessed quadrant. Each column in a quadrant, such as quadrant three, intersects all four active rows. The column addresses in quadrants one and three extend from zero to 511. The addressing scheme is similar for quadrants two and four. For each bit that is eventually output by the DRAM, the active column and the active physical rows access four bits in a quadrant. Additional circuitry on the DRAM selects certain of the four accessed bits and places them on the appropriate output data pin(s). In this example, two bits are selected from the physical rows accessed in quadrant three, corresponding to output DQs 2 and 3, and two bits are selected from the physical rows accessed in quadrant one, corresponding to output DQs 1 and 4.

Before shipping a DRAM semiconductor chip, it must be tested to ensure that all the memory cells function properly. One conventional method of testing a DRAM is to have an external testing device store data in every memory cell in the DRAM, and then read out every memory cell in the DRAM. In this manner, DRAM defects can be detected by comparing the known input data to the output data. However, as DRAMs increase in capacity, accessing all the memory cells begins to take an inordinate amount of time. For example, in the case of a 4 Meg×4 DRAM, conventional testing techniques would require four million write cycles and four million read cycles to fully test the DRAM one time.

A second conventional method decreases testing time by taking advantage of the fact that multiple bits are sensed when a row address is accessed in a quadrant. In this method, circuitry is placed on the DRAM chip, which operates on multiple data bits sensed for each row address. The circuitry transmits a logic one if all the sensed data bits are a logic one, a logic zero if all the sensed data bits are a logic zero, and enters a high impedance state if the data bits are mixed, i.e., both logic ones and zeros.

To perform a DRAM test with the second conventional method, the external testing unit, for each column address, writes either all ones or all zeroes to each row address to be tested, and then performs a read operation on the addresses. For each address read by the testing unit, the internal DRAM test circuitry outputs a one, zero, or high impedance state, thus informing the testing unit whether any of the bits sensed in the row address are bad. By testing a plurality of data bits simultaneously, testing time is reduced.

A goal of both of the above described conventional testing techniques is to replace defective addresses when found. One way to do this is to fabricate the DRAM memory arrays with extra rows and columns of cells, which can be substituted for rows or columns of cells found to be defective. These extra rows and columns are known as redundant elements. Essentially, when a defective row or column is found, fuses are blown, isolating the defective row or column and mapping the redundant row or column to the address previously occupied by the defective row or column. In this manner, a memory array with a limited number of defective elements can be completely repaired. Two types of fuses are commonly used in the repair of DRAMs: laser fuses and electrical fuses. The laser fuse is typically a polysilicon conductor that becomes an open circuit when blown by an externally applied laser beam while the memory die is in wafer form.

The above-described conventional testing and repair techniques require a sophisticated external testing unit, which spends a significant amount of time testing each DRAM. As DRAM sizes increase, the amount of required testing time proportionality increases. For high volume DRAM manufacture, testing time may become unacceptably long.

There is, therefore, a need to reduce the amount of time each DRAM is connected to a testing unit. Additionally, it is desirable to decrease the complexity and expense of external testing units.

Furthermore, the above-described conventional testing techniques have an additional shortcoming. These techniques do not test the speed or timing of the memory cells within the DRAM while they are being tested for accuracy (i.e., correct data) unless connected to an external tester, the external tester having a time-based function and monitoring system. Therefore, it is possible that the memory cells contain the correct data and thus, are reported as being good, but are performing too slowly for the desired application. Accordingly, there is a need and desire to determine the performance of the memory cells within a DRAM with respect to speed as well as accuracy.

SUMMARY OF THE INVENTION

DRAM self-test circuitry performs a self-test of the D-AM memory cells and stores the addresses of failed cells in an on-chip address queue. The failed cell addresses may later be retrieved from the chip and analyzed by an external tester, which may then repair the failed cells. Alternatively, additional on-chip circuitry may analyze and repair the failed cells. In either repair scheme, significant time is saved because the DRAM can perform a complete internal self-test without requiring extensive supervision by an external testing unit.

The advantages and purposes in accordance with this invention will be set forth in the following description and will also be obvious from the description, or may be learned by practicing the invention. The advantages and purpose of the invention will be realized and attained by means of the elements and combinations particularly pointed out in the appended claims.

To obtain the advantages, and in accordance with the purpose of the invention, as embodied and broadly described herein, the present invention is in the form of a DRAM comprising a failed cell address queue and an error detection circuit. The error detection circuit is configured to receive a plurality of bits from the memory array and transmit an error detection signal to the failed cell address queue. The error detection signal is based on the logical value of a plurality of bits, such that the error detection signal indicates an error when the plurality of bits do not all have the same logical value. In response to the error detection signal, the failing address is then stored in the failed cell address queue.

In a second embodiment of the present invention, a DRAM is comprised of a reference circuit, failed address queue and an error detection circuit. The reference circuit is configured to perform the same function as the to-be-tested memory cells and to always generate a reference signal at a time slightly before or equal to the maximum allowable performance time expires. The error detection circuit is configured to receive the reference signal and a plurality of data bits from the memory array. The error detection circuit will transmit an error detection signal to the failed cell address queue when the plurality of bits do not all have the correct logical value or when they arrive after the reference signal (i.e., the memory cells are performing too slowly). In response to the error detection signal, the failing address is then stored in the failed cell address queue.

Both the foregoing general description and the following detailed description are exemplary and explanatory only and do not restrict the invention, as claimed.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings, FIG. 1 is a diagram showing a memory cell array map for a 4 Meg×4 DRAM;

FIG. 2 is a conceptual block diagram illustrating a DRAM with a self-test capability according, to one embodiment of the present invention;

FIGS. 3A and 3B are diagrams illustrating a preferred embodiment of an error detection circuit used in the DRAM illustrated in FIG. 2;

FIG. 10 is a conceptual block diagram illustrating a DRAM with a self-test capability according to a second embodiment of the present invention;

FIG. 11 is a diagram illustrating a preferred embodiment of a reference circuit used in the DRAM illustrated in FIG. 10;

FIG. 12 is a diagram illustrating a preferred embodiment of an error detection circuit used in the DRAM illustrated in FIG. 10;

DETAILED DESCRIPTION

Figure 3B:
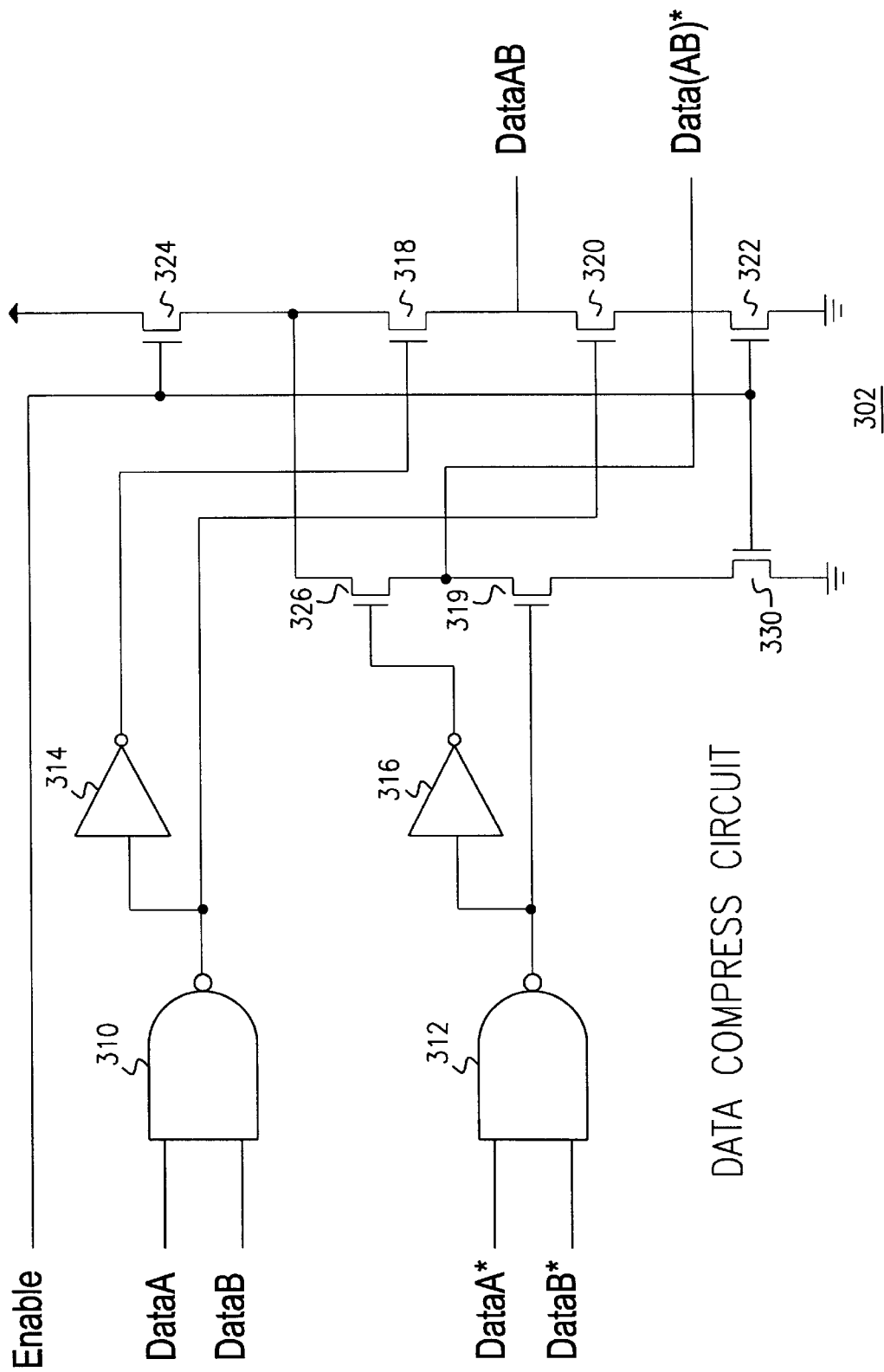

Reference will now be made in detail to the embodiments of the invention, examples of which are illustrated in the accompanying drawings. Wherever possible, the same reference numbers will be used throughout the drawings to refer to the same or like parts.

This invention includes self-test circuitry that, when triggered by an external signal, performs an on-chip test of a DRAM memory array. The self-test circuitry, for each column address, writes either all ones or all zeroes to each set of physical rows having the same address within the segment to be tested, and then reads the rows a set at a time. If the data bits comprising the set do not all equal one or zero, a resultant error detect signal is generated and used to latch the failing address into a failed cell address queue. If the data bits are good, that is, no error is detected, the next set of rows is sensed. When the self test is complete, the failed cell addresses may be transmitted to an external, off-chip device or analyzed and acted on by on-chip error correction circuitry.

Further, in another embodiment, the self-test circuitry includes circuitry to detect transitions between successive failed cell addresses latched in the address queue. If the transition circuitry determines that one or more bits have the same logic in all of the failing addresses, a partialing technique may be employed to repair those DRAMs that have more failed rows/columns than redundant rows/columns by isolating blocks of memory cells including defective cells.

In yet another embodiment, the self-test circuitry is configured to test the accuracy and speed of the DRAM memory cells in comparison to a reference signal generated by a reference circuit. For each column address, the self-test circuitry writes either all ones or all zeroes to each set of physical rows having the same address within the segment to be tested. The self-test circuitry subsequently reads the rows a set at a time while concurrently enabling the logic in the reference circuit. The data bits comprising the set are sent to an error detection circuit. If the data bits do not all equal one or zero (i.e., incorrect data), or if the bits arrive after the reference signal (i.e., the memory exceeds the maximum allowable performance time), a resultant error detect signal is generated and used to latch the failing address into a failed cell address queue. If the data bits are correct and received by the error detection circuit prior to the arrival of the reference signal, that is, no error is detected, the next set of rows is sensed and the reference circuit is re-enabled. When the self-test is complete, the failed cell addresses may be transmitted to an external device. In addition, the failed cell addresses may be analyzed and acted upon by on-chip repair circuitry that may replace failed rows/columns with redundant rows/columns or isolate blocks of defective memory through partialing.

DRAM WITH SELF-TEST CAPABILITY

A DRAM, equipped with a self-test circuit 214 (and capability) according to one embodiment of the present invention, seen in FIG. 2, is preferably implemented on semiconductor chip 200, which includes a plurality of pins 202, such as data I/O pins, address pins, and various control pins, for interfacing chip 200 with the outside world.

Memory array 204, which may be subdivided into quadrants as shown in FIG. 1, includes memory cells that store data. Self-test circuitry 214 includes error detection circuitry 206 and failed address queue 208, both described below in further detail. Column address latch 210 and row address latch 212 store the to-be-accessed column and row addresses. Semiconductor chip 200 and self-test circuitry 214 include additional control circuitry (not shown) for interfacing/decoding data and commands with memory array 204. Such control circuitry is well known in the art and will not be described further.

During normal DRAM operation, to access data, the operator supplies DRAM 200 with row and column addresses. The row and column addresses are stored in the row address latch 212 and column address latch 210, respectively, and are used to access data stored in memory array 204. The row address turns on multiple physical rows having the same address within a segment (e.g., four rows are turned on in a 4 Meg×4 DRAM). The column address determines which one of the data bits sensed on the activated rows should be sent to a DRAM output pin.

Self-test circuitry 214, in response to a command from an external testing unit (not shown), writes either all ones or all zeroes to each set of the physical rows having the same row and column address within the segment to be tested, and then reads the rows a set at a time. The particular pattern of groups of ones and zeroes to be written to the memory array 204 is predetermined and preferably hardwired into self-test circuitry 214.

Preferably, self-test circuitry 214 uses a internal CAS before RAS (CBR) counter, which is the counter normally used in the DRAM refresh cycle to generate the addresses to be accessed. Alternatively, self-test circuitry 214 may use dedicated counters to index through column and row addresses.

Error detect circuit 206 receives the data bits from the physical rows having the same row and column addresses within a segment and generates an error detect signal (EDS) which is received by the failed address queue 208. The error detect signal indicates whether the data bits in a set are good, that is, error free, or whether an error is present. If an error is detected, the failed address corresponding to the set of erroneous memory elements is latched from the column address latch 210 and row address latch 212 to the failed address queue 208.

If all of the bits in the set input to error detect circuit 206 fail, the generated error detect signal EDS may be inaccurate. However, because the probability that all the bits will fail is statistically insignificant, this possibility is not a practical problem.

FIGS. 3A and 3B are diagrams illustrating a preferred embodiment of error detection circuit 206. In FIGS. 3A and 3B, DataA, DataB, DataC, and DataD each represent one of the four data bits in a set having the same address within the segment to be tested. Signals followed by a "*" denote logical complements.

Error detect circuit 206 comprises three data compress circuits 302 and a NOR gate 304. Two of the three data compress circuits 302 receive DataA through DataD and their respective complements. The third data compress circuit 302 receives as inputs the outputs of the first two data compress circuits, labeled as DataAB, Data(AB)*, DataCD, and Data(CD)*. The outputs of the third data compress circuit are gated through NOR gate 304, which generates the error detect signal. The enable signal, when applied to error detect circuit 206, floats the output of the error detect circuit.

The truth table for error detect circuit 206 is shown in Table I.

TABLE I

| Input DataA | DataB | DataC | DataD | Output Data-ABCD | Data-(ABCD)* | Error-Detect |
|---|---|---|---|---|---|---|
| 0 | 0 | 0 | 0 | 0 | 1 | 0 |
| 0 | 0 | 0 | 1 | 0 | 0 | 1 |
| 0 | 0 | 1 | 0 | 0 | 0 | 1 |
| 0 | 0 | 1 | 1 | 0 | 0 | 1 |
| 0 | 1 | 0 | 0 | 0 | 0 | 1 |
| 0 | 1 | 0 | 1 | 0 | 0 | 1 |
| 1 | 1 | 1 | 1 | 0 | 0 | 1 |
| 1 | 0 | 0 | 0 | 0 | 0 | 1 |
| 1 | 0 | 0 | 1 | 0 | 0 | 1 |
| 1 | 0 | 1 | 0 | 0 | 0 | 1 |
| 1 | 0 | 1 | 1 | 0 | 0 | 1 |
| 1 | 1 | 0 | 0 | 0 | 0 | 1 |
| 1 | 1 | 0 | 1 | 0 | 0 | 1 |
| 1 | 1 | 1 | 1 | 1 | 0 | 0 |

FIG. 313 is a detailed circuit diagram of a typical implementation of each data compress circuit 302, which is seen to include a pair of NAND gates 310 and 312, connected to the input lines. The outputs of NAND gates 310 and 312 are fed through inverter circuits 314 and 316, to control the gates of FETs 318 and 326, respectively. The outputs of NAND gates 310 and 312 are also directly applied to control the gates of n-channel FETs 320 and 319, respectively. N-channel FETs 322, 324, and 330 are controlled by an enable input on line Enable. When the Enable line is low, FETs 322, 324, and 330 are turned off, thus floating the outputs DataAB and Data(AB)* of data compress circuit 302.

The truth table for this data compress circuit 302 is shown in Table II.

TABLE II

| Input | | Output | |
|---|---|---|---|
| DataA | DataB | DataAB | Data(AB)* |
| 0 | 0 | 0 | 1 |
| 0 | 1 | 0 | 0 |
| 1 | 0 | 0 | 0 |
| 1 | 1 | 1 | 0 |

Figure 4:
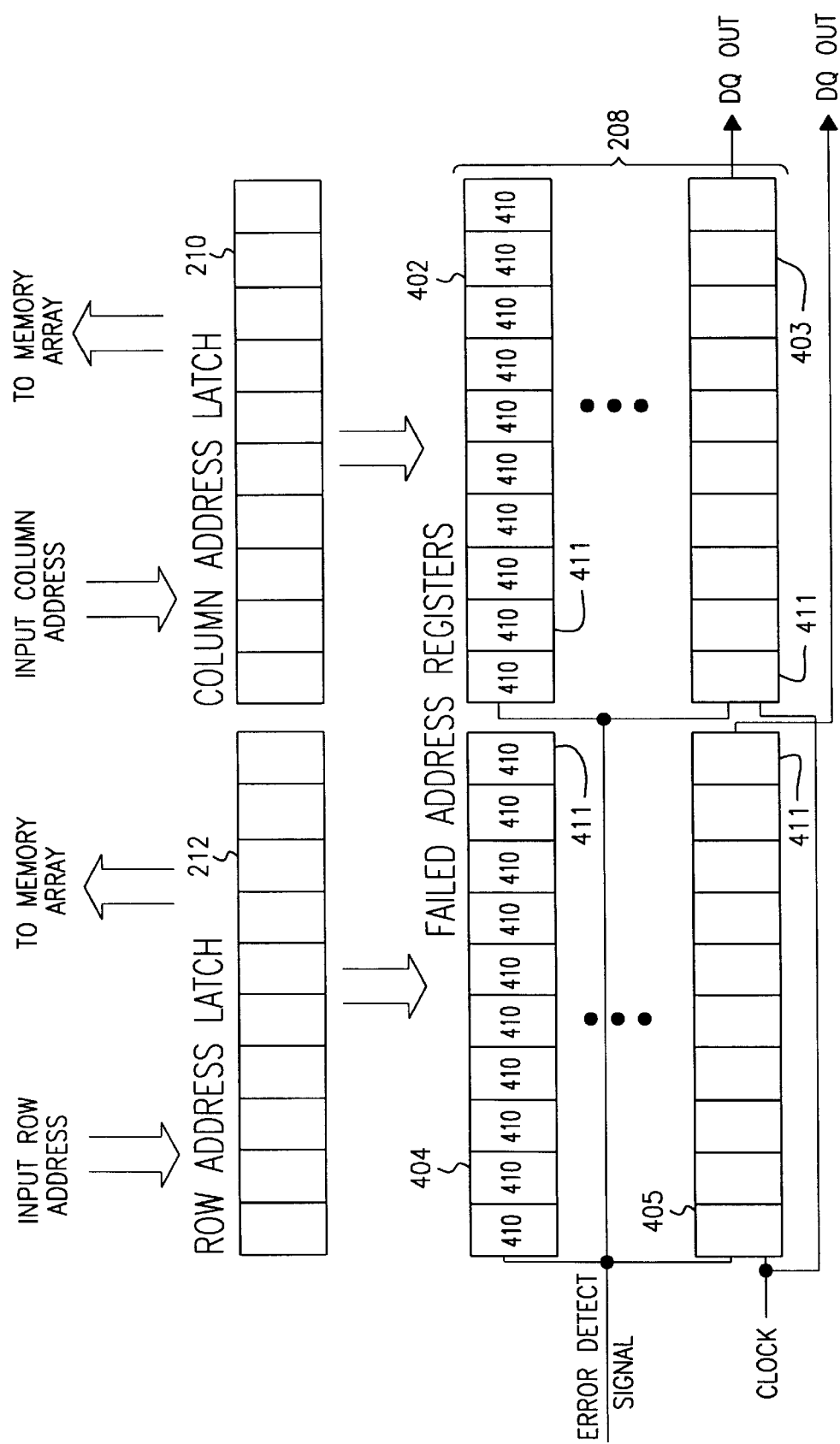
FIG. 4 is a diagram illustrating a first embodiment of a failed cell address queue according to the present invention.

FIG. 4 is a diagram illustrating a first embodiment of a failed address queue 208 consistent with the present invention. Failed address queue 208 operates as a First-in-First-Out (FIFO) queue and typically comprises two or more failed address registers 411, each made up of a column failed address register 402 and a row failed address register 404. Registers 402 and 404 store address data from column address latch 210 and row address latch 212, respectively. Each failed address register 411 preferably comprises a series of delay latches 410. Each delay latch 410 stores one data bit, which is forwarded to the corresponding delay latch 410 in the next failed address register 411, when the error detect signal is active.

During operation, addresses stored in row address latch 212 and column address latch 210 are used to access memory array 204, and the data bits stored at the addressed array locations are sensed and input to the error detect circuit 206. The resultant error detect signal is supplied to control failed address registers 402 and 404. When the error detect signal indicates an error (i.e., a logic high), the row and column addresses in row address latch 212 and column address latch 210 are received by the first failed address register 411 in queue 208. Simultaneously, the failed column and row addresses previously stored in failed address queue 208 are transmitted to the next failed address register 411.

The last failed address register 411 in queue 208 is preferably composed of shift registers 403 and 405. When an error detection cycle is complete, self-test circuitry 214 clocks the shift registers to output the stored failed addresses to an external test device on a bit by bit basis. When all bits in shift registers 403 and 405 have been output, self-test circuitry 214 generates an "artificial" error detect signal, thereby moving the next stored failed address into shift registers 403 and 405. The failed address is then serially clocked out to the external testing unit.

The external testing unit may, for example, store the failed addresses in a database searchable by a unique DRAM ID code. The failed addresses may be repaired by known DRAM repair techniques, such as replacing failed addresses with redundant rows/columns using laser or electrical fuses.

Depending on the specific configuration of the DRAM, failed address queue 208 may include as few as two or three failed address registers 411, or, on the other end of the scale, the number may reach into the thousands. The required number is preferably based upon a statistical analysis of DRAM fail rate balanced against the cost of adding additional registers and the cost of adding redundant memory rows and columns.

Figure 5:
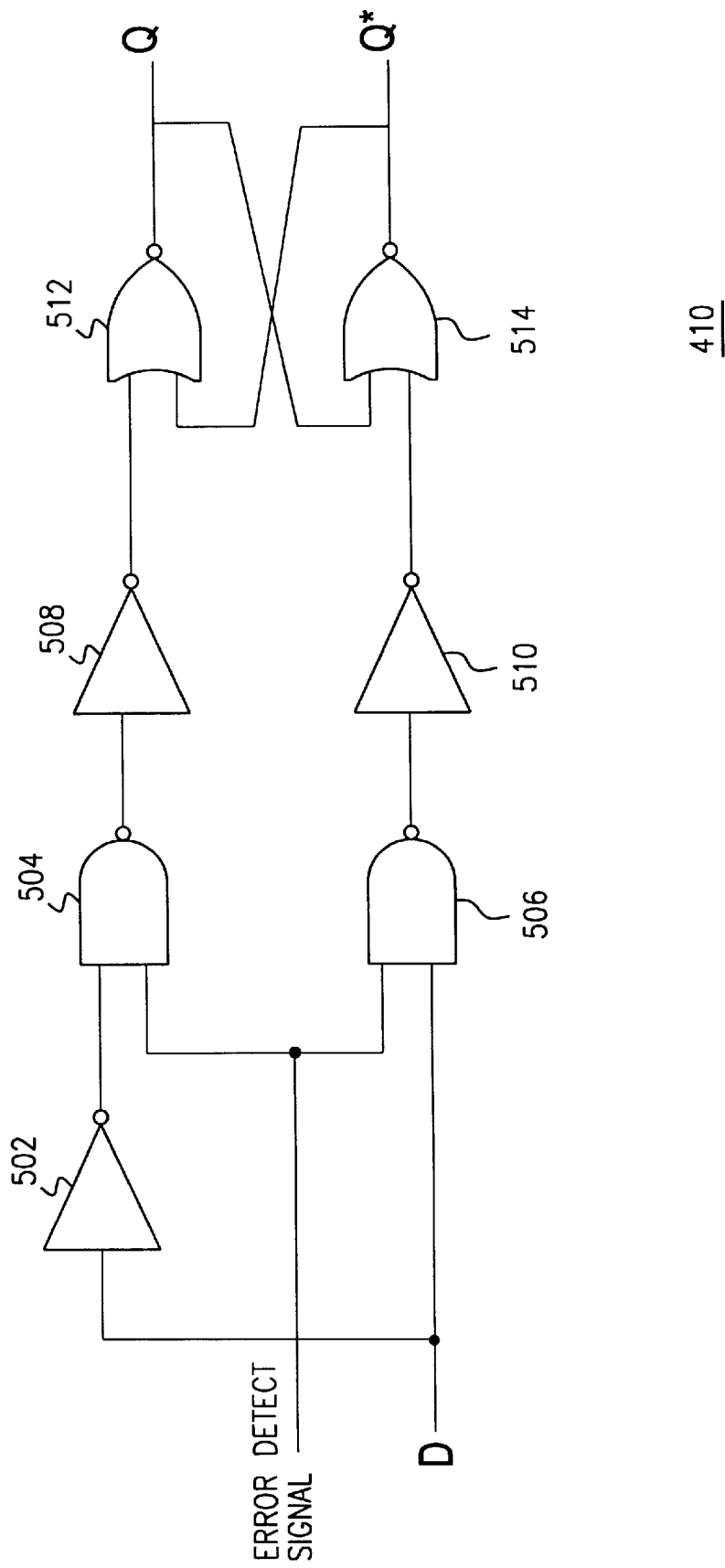
FIG. 5 is a circuit diagram of the preferred implementation of a delay latch according to the present invention.

FIG. 5 is a circuit diagram of a preferred implementation of delay latch 410, used to implement failed address registers 411. Delay latch 410 includes an inverter 502, whose output is received by one of two NAND gates 504 and 506. The output of NAND gates 504 and 506 are input to inverters 508 and 510, respectively, the outputs of which in turn are applied as respective inputs to cross-coupled NOR gates 512 and 514. In operation, a high value pulse input on error detect signal line causes the signal present at input D to propagate through the delay latch to output Q. Once a stable result is present at output Q. it is held there until the error detect signal is again activated.

DRAM WITH SELF-TEST FOR SPEED AND ACCURACY

A DRAM, equipped with a self-test circuit 1002 (and capability) according to a second embodiment of the present invention, seen in FIG. 10, is preferably implemented on semiconductor chip 1000, which includes a plurality of pins 202, such as data I/O pins, address pins, and various control pins, for interfacing chip 1000 with the outside world.

Memory array 204, which may be subdivided into quadrants as shown in FIG. 1, includes memory cells that store data. Self-test circuitry 1002 includes an error detection circuit 1100, a reference circuit 1200 and failed address queue 208. Details of the error detection circuit 1100 and the reference circuit 1200 are provided below. The failed address queue 208 is the same as described above for self-test circuit 214. Column address latch 210 and row address latch 212 store the to-be-accessed column and row addresses. Semiconductor chip 1000 and self-test circuitry 1002 include additional control circuitry (not shown) for interfacing/decoding data and commands with memory array 204 and reference circuit 1200. Such control circuitry is well known in the art and will not be described further.

During normal DRAM operation, to access data, DRAM 1000 is supplied with row and column addresses. The row and column addresses are stored in the row address latch 212 and column address latch 210, respectively, and are used to access data stored in memory array 204. The row address turns on multiple physical rows having the same address within a segment (e.g., four rows are turned on in a 4 Meg×4 DRAM). The column address determines which one of the data bits on the activated rows is sensed and sent to a DRAM output pin.

Self-test circuitry 1002, in response to a command from an external testing unit (not shown), writes either all ones or all zeroes to each set of the physical rows having the same row and column address within the segment to be tested, and then reads the rows a set at a time. The particular pattern of groups of ones and zeroes to be written to the memory array 204 is predetermined and preferably hardwired into self-test circuitry 1002.

Preferably, self-test circuitry 1002 uses a internal CAS before RAS (CBR) counter, which is the counter normally used in the DRAM refresh cycle to generate the addresses to be accessed. Alternatively, self-test circuitry 1002 may use dedicated counters to index through column and row addresses.

FIG. 11 illustrates an exemplary reference circuit 1200 used in self-test circuit 1002. As will be described below, the circuit 1200 is configured to always output the correct self-test data within a maximum allowable performance time of the DRAM. The reference circuit 1200 contains a reference memory cell 1202 and a delay circuit 1204. A one or zero is stored into reference memory cell 1202 depending upon the self-test pattern to be written into the memory array 204. That is, the reference memory cell 1202 always contains the correct self-test result. Accordingly, the contents of the cell 1202 is used as a reference by the error detection circuit 1100 to judge the correctness of the memory array 204. Preferably, the one or zero is hardwired into the reference memory cell 1202. The self-test circuitry 1002 includes additional control circuitry (not shown) for interfacing with and decoding the data stored within the reference memory cell 1202. Such control circuitry is well known in the art and will not be described further.

The reference memory cell 1202 is connected to the delay circuit 1204 such that when a control signal is received by the reference circuit 1200, the contents of the cell 1202 is input into the delay circuit 1204. The delay circuit 1204 will subsequently output the contents of the cell 1202 as a reference signal to the error detection circuit 1100 after a predetermined delay time (also referred to as the delay). The length of the delay corresponds to a time period that is slightly less or equal to the maximum allowable performance time of the DRAM. That is, the reference signal output from the reference circuit 1200 will always be sent to the error detection circuit before the maximum allowable performance time has expired. Accordingly, the reference signal is also used by the error detection circuit 1100 as a reference to judge the speed of the memory array 204. It must be noted that the determination of the maximum allowable performance time is application specific. Accordingly, the timing of the reference signal may be adjusted by modifying the delay circuit 1204 to incorporate a delay that satisfies an application's performance requirements.

Error detect circuit 1100 is configured to receive the reference signal and the data bits from the rows of the memory array 204 being tested. The error detect circuit 1100 determines if the data bits are correct and if they were received within the maximum allowable performance time for the DRAM. The error detect circuit 1100 generates an error detect signal (EDS) having two possible values; one value indicating that an error has been detected, and another value indicating that the memory is both correct and performing within the maximum allowable performance time. The EDS is sent to the failed address queue 208. If an error is detected, the failed address corresponding to the set of erroneous memory elements is latched from the column address latch 210 and row address latch 212 to the failed address queue 208 as described above with reference to FIGS. 3A–4.

FIG. 12 illustrates an error detection circuit 1100 used by the self-test circuit 1002. Error detection circuit 1100 includes a pre-processing circuit 1102, an error detection control circuit 1110 and a detection logic circuit 1130. The logic circuit 1130 is connected to the pre-processing circuit 1102 and the control circuit 1110. Inputs to the logic circuit 1130 include the reference signal and the outputs of the control circuit 1110 and the pre-processing circuit 1102.

Figure 13:
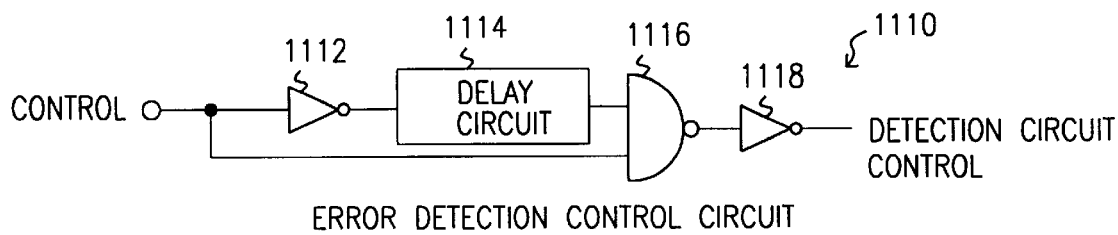
FIG. 13 is a diagram illustrating a preferred embodiment of an error detection control circuit used in the error detection circuit illustrated in FIG. 12.
Figure 14:
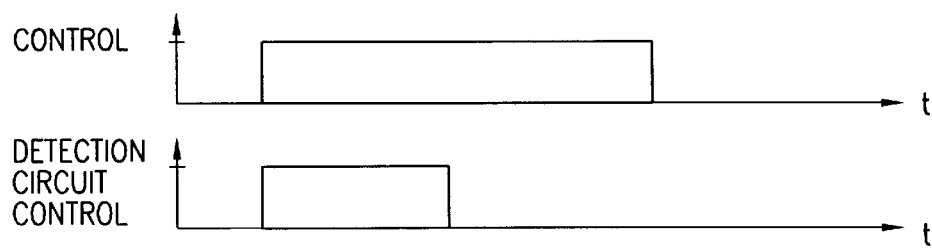
FIG. 14 is a timing diagram of an error detection control signal used by the error detection circuit illustrated in FIG. 12.

FIG. 13 illustrates an exemplary error detection control circuit 1110 which may be used in the error detection circuit 1100 (FIG. 12). The control circuit 1110 includes two inverters 1112, 1118, a delay circuit 1114 and a NAND gate 1116. The input to inverter 1112 is connected to the control signal 1133 generated by the self-test circuitry 1002. The control signal 1133 is also used as an input to the NAND gate 1116. The output of the inverter 1112 is fed to a delay circuit 1114. The output of the delay circuit 1114 provides the second input to the NAND gate 1116. The output of the NAND 1116 is fed to the second inverter 1118. The output of the second inverter 1118 is the pulsed detection circuit control signal 1131. FIG. 14 illustrates the resultant pulsed detection circuit control signal 1131 in comparison to the control signal 1133 generated by the self-test circuitry 1002.

The operation of the error detection control circuit 1110 is as follows. A logic one control signal 1133 is received from the self-test circuitry 1002. The control signal 1133 causes the output of the second inverter 1118 to be a logic one (i.e., the detection circuit control signal 1131 goes high and enables the detection logic circuit 1130) and concurrently enables the delay circuit 1114. The delay circuit 1114 will delay the signal applied to it for a predetermined amount of time before sending an inverted control signal 1133 to the NAND gate 1116. The inverted control signal 1133 causes the output of the NAND gate 1116 to be a logic one which causes the output of the second inverter 1118 to be a logic zero (i.e., the detection circuit control signal 1131 goes low and disables the detection logic circuit 1130). The length of the delay corresponds to a time period that is slightly longer than the maximum allowable performance time of the DRAM. As such, the delay circuit ensures that a test window is big enough to properly determine the status of the tested DRAM memory prior to terminating the test. The timing of the detection circuit control signal 1131 may be adjusted by modifying the delay circuit 1114 to incorporate a delay that satisfies an application's performance requirements (in the same manner as delay circuit 1204 illustrated in FIG. 11).

Figure 15:
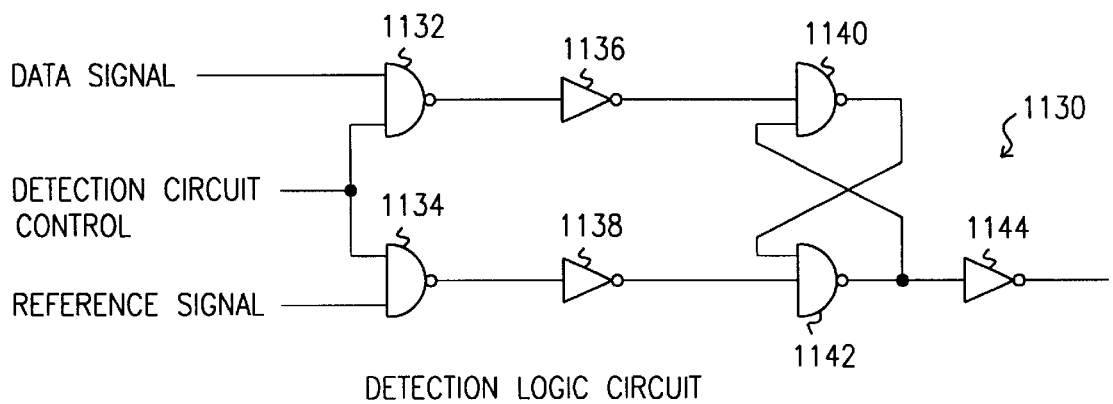
FIG. 15 is a diagram illustrating a preferred embodiment of a detection logic circuit used in the error detection circuit illustrated in FIG. 12.

FIG. 15 illustrates an exemplary detection logic circuit 1130. The logic circuit 1130 includes four NAND gates 1132, 1134, 1140, 1142 and three inverters 1136, 1138, 1144. Inputs to NAND gate 1132 include a data signal from the pre-processing circuit 1102 and a detection circuit control signal from the error detection control circuit 1110. The output of NAND gate 1132 is connected to inverter 1136. Inverter 1136 is connected to one input of NAND gate 1140. Inputs to NAND gate 1134 include the reference signal from the reference circuit 1200 and a detection circuit control signal from the error detection control circuit 1110. The output of NAND gate 1134 is connected to inverter 1138. Inverter 1138 is connected to one input of NAND gate 1142. NAND gates 1140, 1142 are connected in a cross-coupled manner such that the output of NAND gate 1142 is connected to the second input of NAND gate 1140 while the output of NAND gate 1140 is connected to the second input of NAND gate 1142. The output of NAND gate 1144 is also connected to the third inverter 1144. The output of the third inverter 1144 is the EDS.

The operation of the detection logic circuit 1130 is as follows. The circuit 1130 as illustrated is configured to receive expected inputs that are a logic one. When the self-test circuitry 1002 initiates the testing of the memory array 204, a control signal 1133 is sent to the error detection control circuit 1110 which outputs a pulsed detection circuit control signal 1131 (FIG. 14) to NAND gates 1132, 1134 of the detection logic circuit 1130. This signal 1131 creates a window in which the test is to be completed by. While receiving the detection circuit control signal 1131, the logic circuit 1130 is ready for a logic one input from either the reference signal or the data signal. If a logic one data signal is received by NAND gate 1132 before NAND gate 1134 receives the reference signal, an EDS with a logic zero is output from the third inverter 1144 indicating that there is no error. If the reference signal is received by NAND gate 1134 before NAND gate 1132 receives a logic one data signal (i.e., the memory is performing too slowly), or after NAND gate 1132 receives a logic zero data signal (i.e., incorrect data) an EDS with a logic one is output from the third inverter 1144 indicating that there is an error and that the failed address queue 208 must store the failed address as described above with reference to FIGS. 3A–4.

Figure 16:
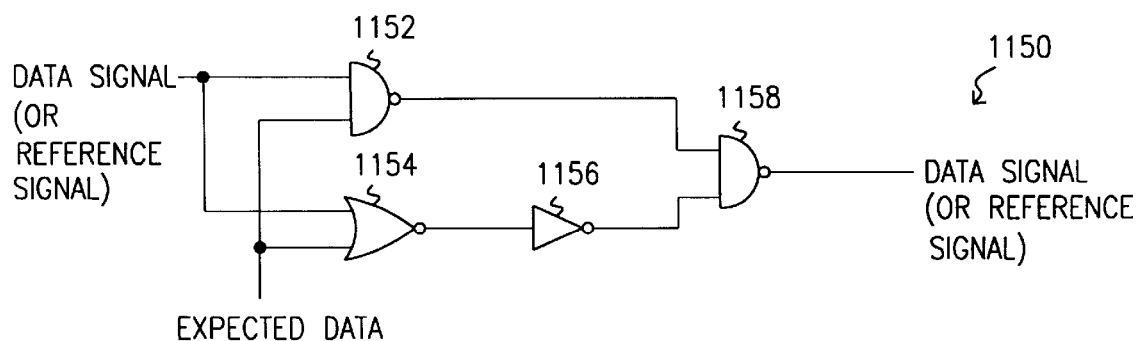
FIG. 16 is a diagram illustrating a preferred embodiment of a result inverter circuit used in the error detection circuit illustrated in FIG. 12.

It must be noted that if it were desired to have expected inputs that were logic zero, the inversion circuit illustrated in FIG. 16 would be required to convert the logic zero data signal and the reference signal to a logic one to comply with the detection logic circuit 1130 illustrated in FIG. 15. Alternatively, the logic circuit 1130 could be modified to expect logic zero inputs as well. As shown in FIG. 16, the inversion circuit contains a two NAND gates 1152, 1158, a NOR gate 1154 and an inverter 1156. The inputs to NAND gate 1152 and the NOR gate 1154 include an expected data signal having a logic value of zero or one and the data signal from the data compression circuit 1002 or the reference signal. The output of the NAND gate 1152 is fed to the second NAND gate 1158 while the output of the NOR gate 1154 is inverted by inverter 1156 and then fed to the second NAND gate 1158. When a data signal or reference signal having a logic zero arrives, the circuit 1150 outputs a logic one from the second NAND gate 1158.

Figure 17:
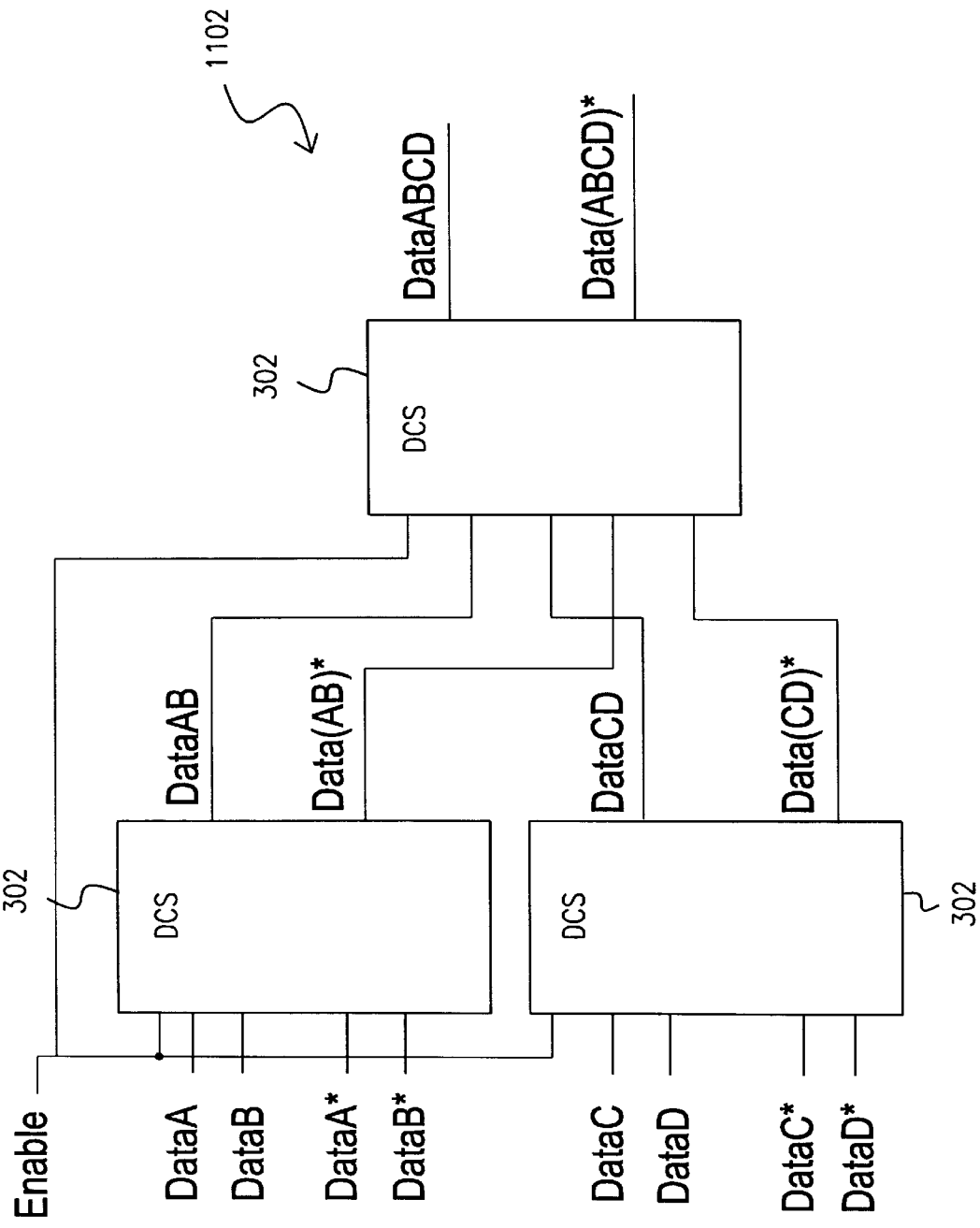
FIG. 17 is a diagram illustrating a preferred embodiment of a data compression circuit used in the error detection circuit illustrated in FIG. 12.

FIG. 17 illustrates an exemplary pre-processing circuit 1102 which may be used in the error detection circuit 1100 (FIG. 12). The pre-processing circuit 1102 receives the data bits in the addressed set of rows and combines them into one data signal. The data signal is subsequently fed to the detection logic circuit 1130 to determine if there is an error. The pre-processing circuit is very similar to the error detection circuit 206 (FIG. 3A) used in the self-test circuitry 214 of the first embodiment of the present invention. Pre-processing circuit 1102 contains three data compress circuits 302. Two of the three data compress circuits 302 receive DataA through DataD and their respective complements (denoted by a "*"). The third data compress circuit 302 receives as inputs the outputs of the first two data compress circuits, labeled as DataAB, Data(AB)*, DataCD, and Data (CD)*. The DataABCD output of the third data compress circuit 302 is used as the data signal sent to the detection logic circuit 1130. If any of the data bits received does not have the correct data then DataABCD will not have the same logic value as the reference signal. Therefore, the addressed memory is defective (i.e., the memory contains incorrect data). Alternatively, if DataABCD is received by the detection logic circuit 1130 after the arrival of the reference signal, whether or not DataABCD has the same logic value as the reference signal, the addressed memory is defective (i.e., the memory is performing too slowly). In either case, the logic detect circuit 1130 will generate a logic one EDS indicating that there is an error and that the failed address queue 208 must store the failed address as described above with reference to FIGS. 3A–4.

It must be noted that if the pre-processing circuit 1102 would not be required if only one memory cell were tested at a time since there would not be a need to combine multiple data bits into one data signal. Conversely, the detection logic circuit 1130 could also be adapted to receive and compare multiple bits that were not combined by a pre-processing circuit 1102. It must also be noted that logic values for the control and detection control signals, as well as any other signal or logic value used in the self-test circuit 1002, could be either one or zero and that the values referred to are only exemplary.

DRAM WITH SELF-TEST AND REDUNDANT ROW/COLUMN SELF-REPAIR

Figure 6:
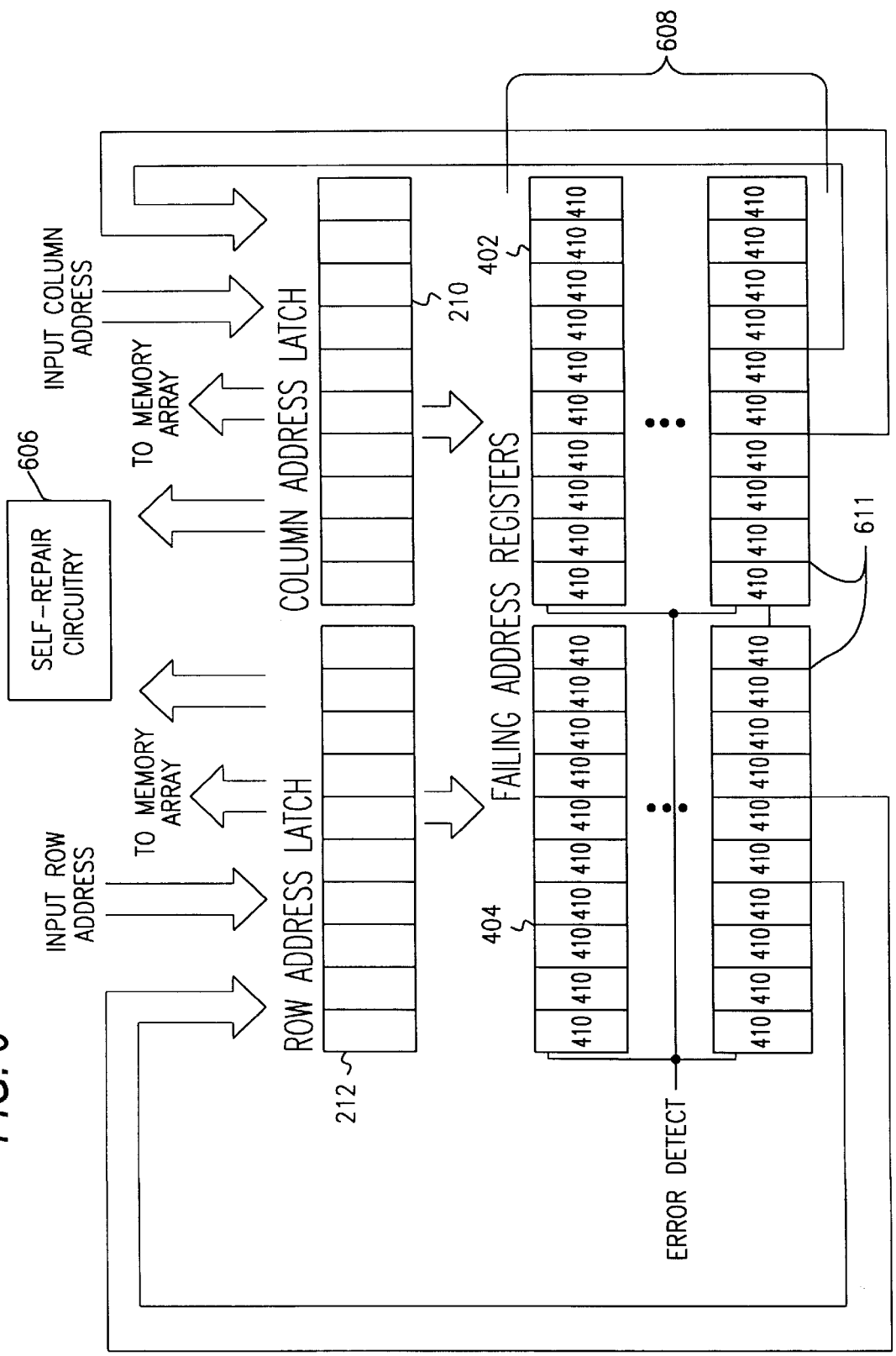
FIG. 6 is a diagram illustrating a second embodiment of a failed cell address queue according to the present invention.

FIG. 6 is a diagram illustrating a second embodiment of failed address queue, indicated by 608. In this embodiment, the failed address queue interacts directly with self-repair circuitry within the DRAM.

Failed address queue 608 is constructed similarly to the failed address queue 208 of FIG. 4. The difference is that instead of using shift registers for the last failed address register, the last failed address queue 608 is comprised of delay latches 410 coupled to feed their outputs back into row address latch 212 and column address latch 210.

When the failed addresses have been stored in failed address queue 608, self-test circuitry 214 or self-test circuitry 1002 initiates a self-repair sequence by enabling self-repair circuitry 606 and by clocking the failed addresses stored in failed address register 611 to column address latch 210 and row address latch 212. As the successive failed addresses are written into row address latch 212 and column address latch 210, self-repair circuitry 606 reads the failed addresses and replaces them with redundant rows and/or columns by blowing electrical fuses on the DRAM.

DRAM WITH SELF-TEST AND PARTIALING

Occasionally, the number of failed rows/columns exceeds the number of available redundant rows/columns. In this situation, it is impossible to repair the DRAM to its intended capacity. Some portion of the DRAM can still be salvaged, however, if the failed addresses occur in a range that may be disabled. For example, if the test circuitry determines that all failing bits occur when the first row address bit is logic one, the first row address bit may be forced to always maintain a logic zero. Forcing an address bit to a single logic state is called partialing. In this example, partialing reduced the available addressable memory cells by one-half, but a DRAM with half its intended memory capacity is more useful than an unsalvageable one.

Figure 7:
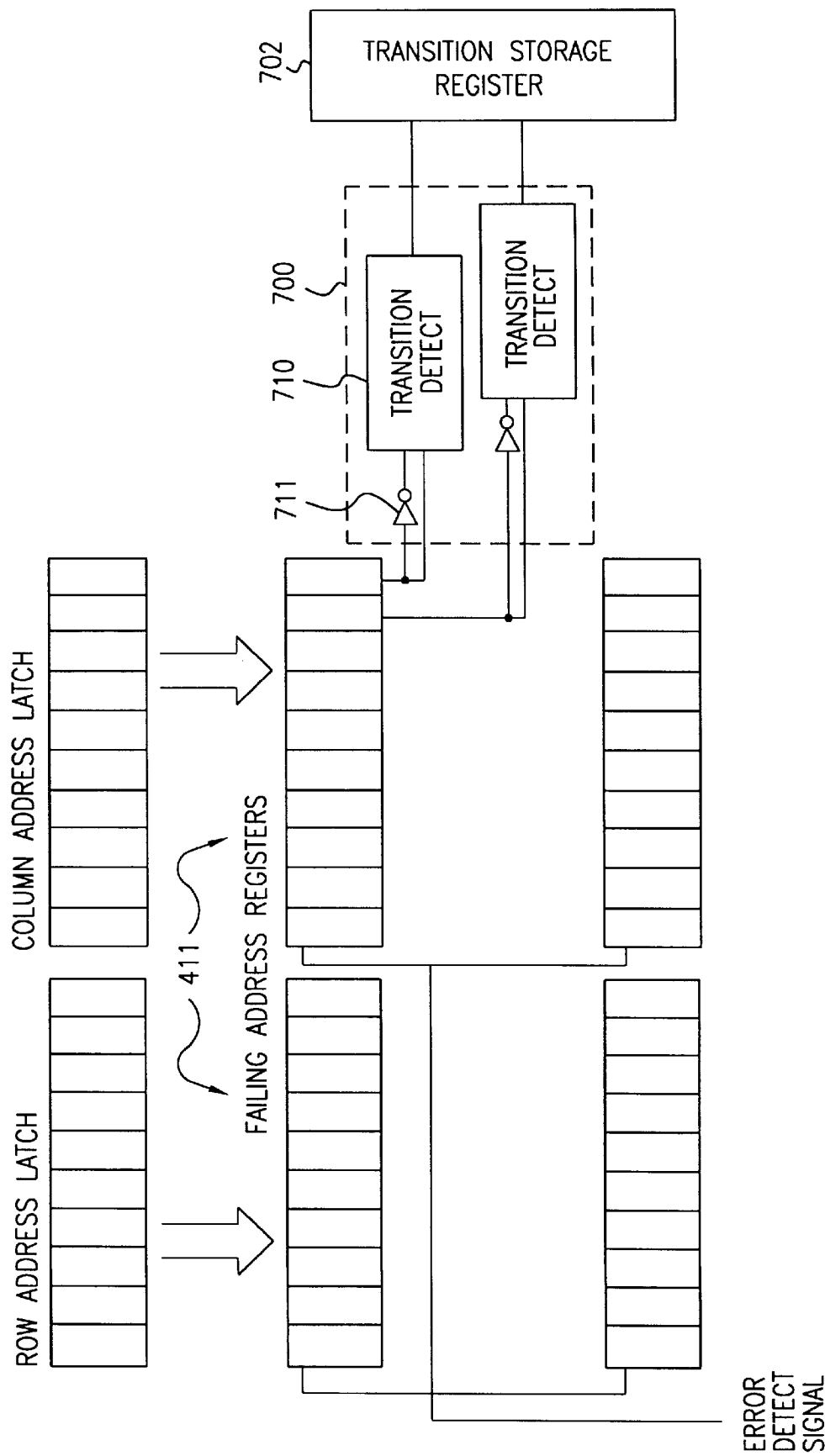
FIG. 7 is a diagram illustrating a third embodiment of a failed address queue according to the present invention.
Figure 8:
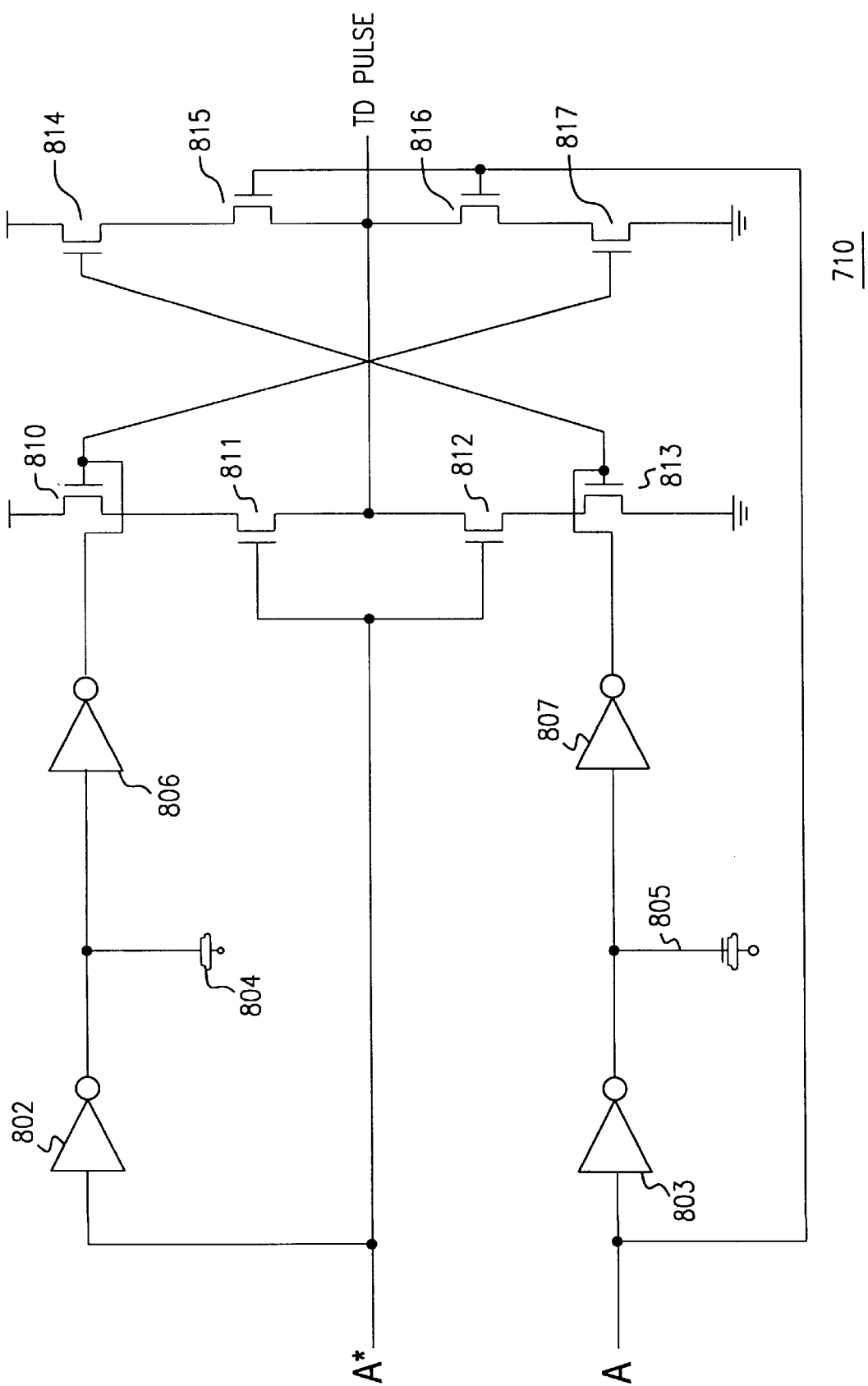
FIG. 8 is a circuit diagram of the preferred implementation of transition detect circuitry according to the present invention.

FIGS. 7 and 8 illustrate an embodiment of a failed address queue according to the present invention for detecting failed address ranges. This embodiment stores failed addresses identically to the embodiment shown in FIG. 4. However, this embodiment also includes transition detect circuity 700, for receiving each bit of each failed address from the first failing address register 411, and transition detect storage register 702, for monitoring and storing signals from transition detect circuitry 700.

Transition detect circuitry 700 includes transition detection logic 710 and an inverter 711. Preferably, each bit in failed addresses register 411 is connected to one of transition logic 710 and inverter 711, although only the first two bit stages of failed address register 411 are shown so connected in FIG. 7.

In operation, each output bit and its complement from failed address register 411 is received by transition logic 710. If transition logic 710 detects a transition or a change either from a logic one to a logic zero, or from a logic zero to a logic one, it pulses low its normally high state. The low pulse is detected by transition storage register 702, which stores an indication that a pulse was received. At the end of a testing cycle, self-test circuitry 214 or self-test circuitry 1002 analyzes the results held in transition storage register 702. If the results indicate that one of the address bits has the same logical value for all the failed addresses (i.e., transition storage register 702 did not receive a pulse), that address bit is determined to be eligible for partialing.

FIG. 8 is a circuit diagram of an exemplary embodiment of transition logic circuit 710 in FIG. 7. Transition logic 710 includes a pair of input inverters 802 and 803, whose outputs are connected to ground through capacitors 804 and 805 and also as inputs to a second pair of inverters 806 and 807, respectively. The outputs of inverters 806 and 807 are connected to FETs 810 and 813, respectively. FETs 811, 812, 814, 815, 816, and 817, are connected as shown to complete the transition logic. The node of a output transition detect (TD) pulse is connected to the node shared by FETs 811, 812, 815 and 816. Data A* input is applied to the input of inverter 802 and to the gates of FETs 811 and 812, while Data A input is applied to the input of inverter 803 and the gates of FETs 815 and 816.

In operation, capacitors 804 and 805 delay the inputs A and A*, which control FETs 810, 814, 813, and 817. A and A*, however, are applied directly to control FETs 811, 812, 815, and 816. When the inputs change state, the non-delayed signals control FETs 811, 812, 815, and 816, causing the output TD to change state. After a delay, the inputs are supplied to the gates of FETs 810, 814, 813, and 817, forcing output TD back to its original state. In this manner, a negative output pulse proportional in duration to the capacitance of the capacitors 804 and 805 is created.

SELF-TEST DRAM WITH REDUCED STORAGE REQUIREMENTS

In some instances, the number of available storage spaces in the failed address queue may not be enough to handle all of the failed addresses.

Figure 9A:
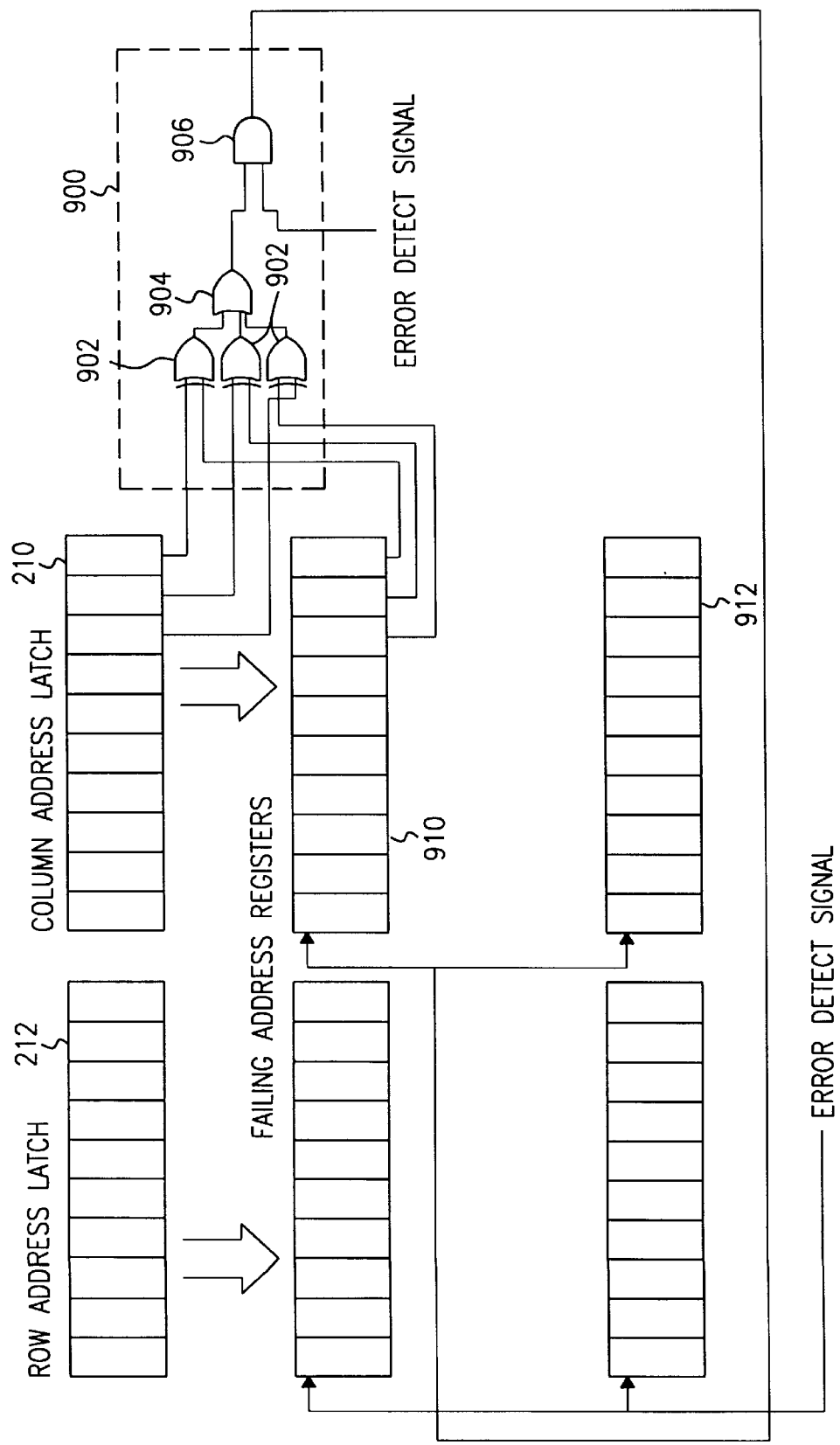
FIGS. 9A and 9B are diagrams illustrating additional embodiments of a failed cell address queue according to the present invention.

FIG. 9A illustrates an embodiment of a failed address queue according to the present invention for storing failed addresses in a compressed form. In this embodiment, address change detection circuitry 900 detects whether a new failed address in column address latch 210 is the same as the failed address previously stored in the column failing address register 910. If the addresses are not the same, the error detect signal pulse is passed through AND gate 906, causing the new failed address to be written into register 910 and the previously stored failed address to be written into register 912. In this manner, identical failing column addresses are not redundantly stored in the failing address registers.

Address change detection circuitry 900 includes a series of XOR gates 902, each having one input connected to the output of column address latch 210 and the other input connected to the output of register 910. For simplicity, only three XOR gates are shown in FIG. 9, although there would actually be one XOR gate for each bit in the column address. If there is a difference in one of the XOR gate inputs, a logic one is propagated through OR gate 904, thus enabling AND gate 906 to pass the error detect signal EDS. If all the XOR gates have identical inputs, a logic zero is propagated through OR gate 904, thus disabling the error detect signal EDS from advancing the failed column addresses from the failed column address register 910 to the failed column address register 912.

The embodiment of the failed address queue shown in FIG. 9A only stores identical failing column addresses that occur adjacent to one another. That is, if a first failing column address X is separated from a second failing column address X by a third failing column address Y, column address X would be stored twice because the intermediate column address Y would effectively clear the memory of address change detection circuitry 900. If one desires to exclude failed non-adjacent addresses from storage, additional circuitry could be used to cycle the previously stored addresses through register 910 for each failing address detected in latch 910.

Figure 9B:
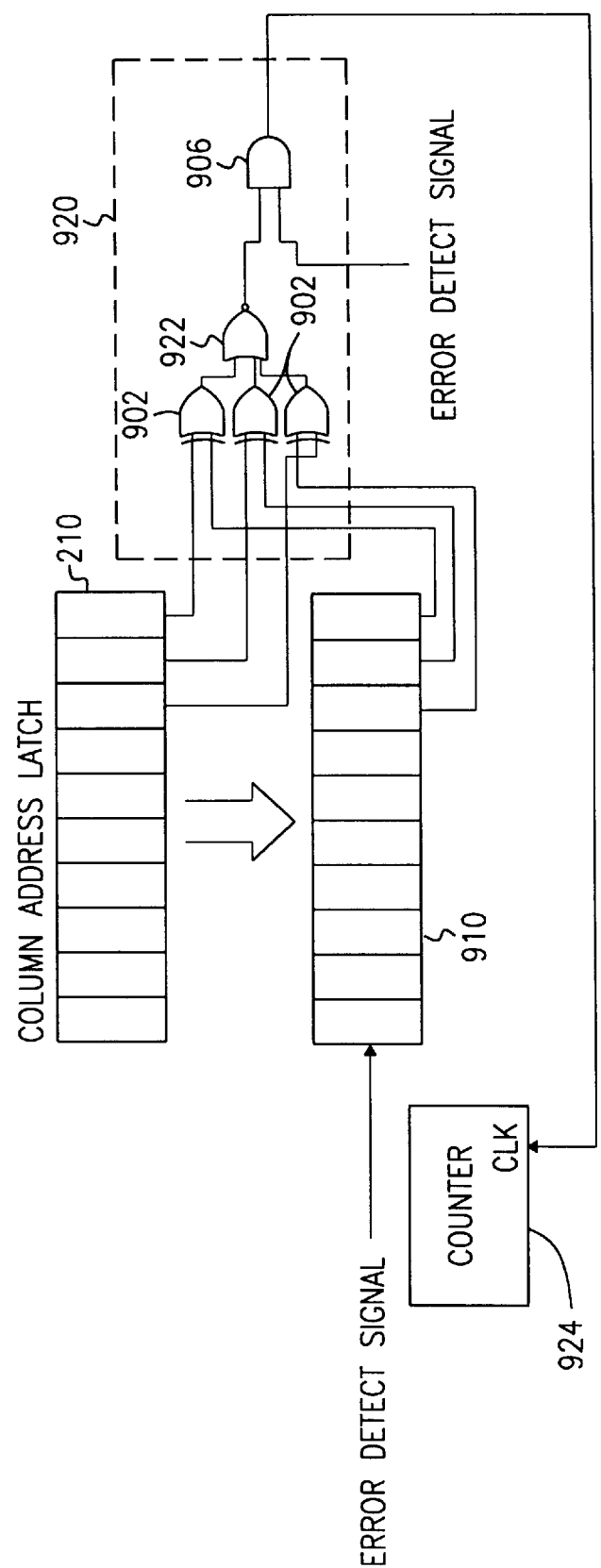

FIG. 9B illustrates an alternate embodiment of a failed address queue according to the present invention for storing failed addresses in a compressed form. In this embodiment, address change detection circuitry 920 is similar to address change detection circuitry 900 except that OR gate 904 is replaced with NOR gate 922. Address detection circuitry 920 detects whether a new failed address in column address latch 210 is the same address previously stored in the column failing address register 910. If the addresses are the same, the EDS signal passes through AND gate 906, incrementing counter 924. In this manner, the number of identical failing column addresses can be saved without independently storing each failing address in a separate register. If multiple fails are detected at the same column address, the column is given a high priority for replacement with a redundant column (i.e., the column is called a "must" repair column).

Although a column address is shown as the detected address in FIG. 9B, row addresses could equivalently be detected. Indeed, multiple row addresses and/or columns may simultaneously be detected using multiple failing address registers 910 and multiple corresponding address change detection circuits 920. Additionally, although a general counter is shown in FIG. 9B, the counter may be as simple as a single bit storage element. In this case, flipping the storage bit signifies that at least two fails of the same address have been detected, and the failed address should be considered a "must" repair.

Figure 18:
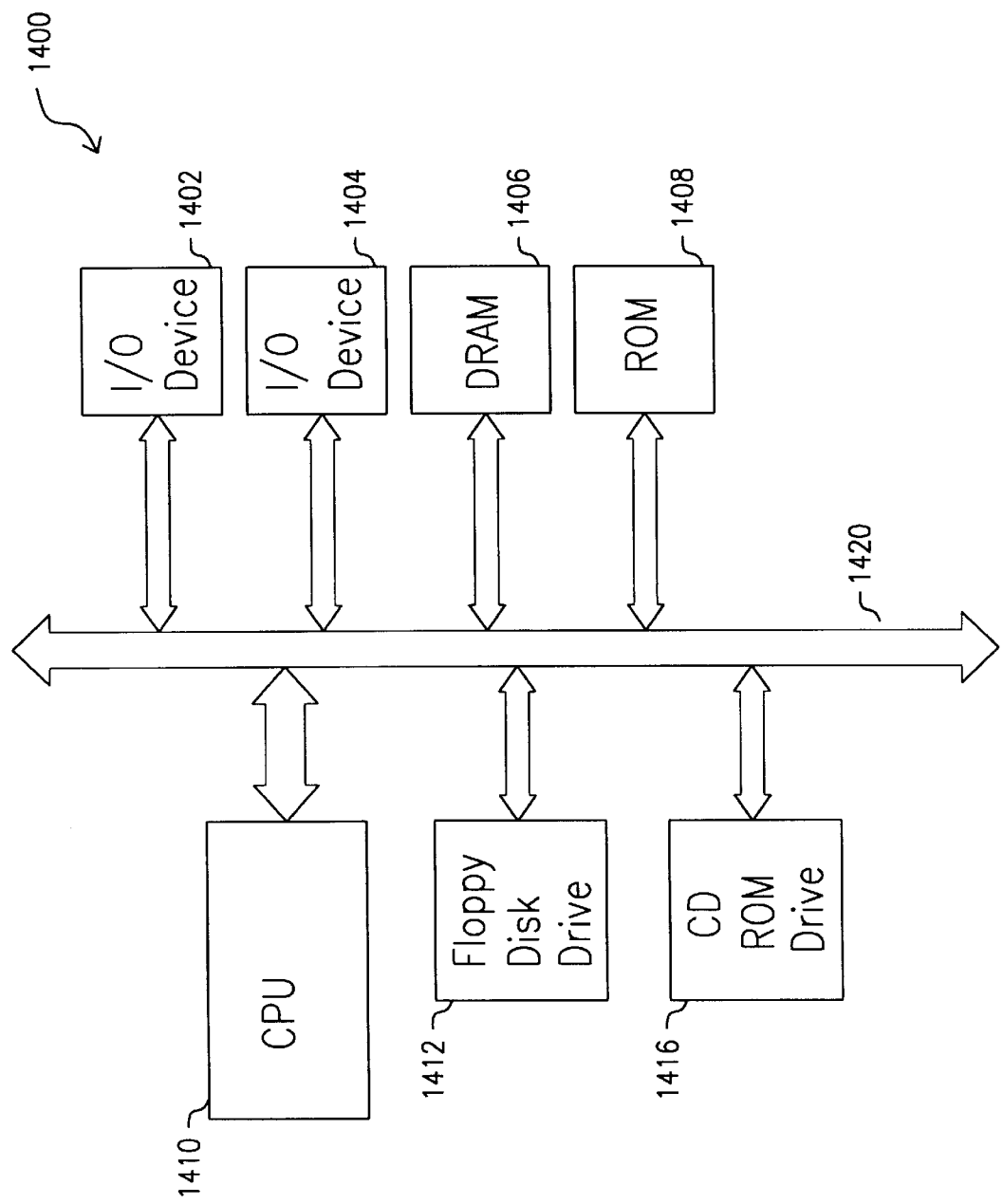
FIG. 18 is a block diagram illustrating a computer system utilizing a DRAM with a self-test capability according to either embodiment of the present invention.

FIG. 18 illustrates a computer system 1400 containing DRAM 1406. The DRAM 1406 includes either self-test circuit 214 or self-test circuit 1002 constructed in accordance with the present invention. The computer system 1400 also includes a central processing unit (CPU) 1420 that communicates to the DRAM 1406 and an input/output (I/O) device 1402 over a bus 1420. A second I/O device 1404 is illustrated, but is not necessary to practice the invention. The computer system also includes read only memory (ROM) 1408 and may include peripheral devices such as a floppy disk drive 1412 and a compact disk (CD) drive 1416 that also communicate with the CPU 1410 over the bus 1420 as is well known in the art. The DRAM 1406 has a self-test capability that operates as described above with reference to FIGS. 2–17.

It will be apparent to those skilled in the art that various modifications and variations can be made to the present invention without departing from the scope or spirit of the invention. For example, although above embodiments were all described with reference to a DRAM, the concepts disclosed herein could also be applied to testing of semiconductor memories such as static random access memories (SRAM) or Flash memories. The concepts of the invention may also be applied to non-semiconductor memories as well. while the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention.

What is claimed as new and desired to be protected by Letters Patent of the United States is:

1. A memory comprising:

a memory array;

a detection circuit including logic circuitry connected to receive a data signal representing at least one data bit fetched from said memory array, said detection circuit determines whether said at least one data bit is fetched within a predetermined period of time.

2. The memory according to claim 1 wherein said detection circuit generates an error detection signal when said data bit is not fetched within said predetermined period of time.

3. The memory according to claim 2 further comprising:

a failed address queue connected to said detection circuit, said failed address queue for storing at least a failed memory address in response to an error detection signal generated when said data bit is not fetched within said predetermined time.

4. The memory according to claim 1 wherein said detection circuit also determines whether said at least one data bit has an expected value of a predefined logic level.

5. The memory according to claim 4 wherein said detection circuit generates an error detection signal when said at least one data bit has value other than said predefined logic level.

6. The memory according to claim 1 further comprising:

a reference circuit to generate a reference signal in response to a first control signal; and said detection circuit determines whether said at least one data bit is fetched within a predetermined period of time measured by said reference signal.

7. The memory according to claim 6 wherein said detection circuit generates an error detection signal when said data bit is not fetched within said predetermined period of time measured by said reference signal.

8. The memory according to claim 7 wherein said predetermined period of time measured by said reference signal is a time prior to the arrival of said reference signal.

9. The memory according to claim 6 wherein said detection circuit also determines whether said at least one data bit has an expected value of a predefined logic level measured by said reference signal.

10. The memory according to claim 9 wherein said detection circuit generates an error detection signal when said at least one data bit has value other than said predefined logic level measured by said reference signal.

11. The memory according to claim 6 wherein said reference circuit comprises:

a reference memory cell; and a first delay circuit connected to said reference memory cell and said detection circuit, said first delay circuit receiving data from said reference memory cell and transmitting said reference signal to said detection circuit a predetermined time after receipt of said data from said reference memory cell.

12. The memory according to claim 11 wherein said predetermined delay is a time slightly less than a maximum allowable performance time of said memory array.

13. The memory according to claim 11 wherein said predetermined delay is a time equal to a maximum allowable performance time of said memory array.

14. The memory according to claim 6 wherein said detection circuit comprises:

a detection control circuit responsive to a first control signal to generate a second control signal; and a detection logic circuit for generating said detection signal, said detection logic circuit being responsive to said second control signal, said detection logic circuit being connected to said data signal and said reference signal.

15. The memory according to claim 14 wherein said detection circuit further comprises:

a pre-processing circuit connected to said memory array and said detection logic circuit, said pre-processing circuit combining a plurality of data bits read from said memory array to generate said data signal, said pre-processing circuit transmitting said data signal to said detection logic circuit.

16. The memory according to claim 6 further comprising:

a failed address queue connected to said detection circuit, said failed address queue for storing at least a failed memory address in response to an error detection signal generated when said data bit is not fetched within said predetermined time.

17. An integrated circuit comprising:

a memory array;

a detection circuit including logic circuitry connected to receive a data signal representing at least one data bit fetched from said memory array, said detection circuit determines whether said at least one data bit is fetched within a predetermined period of time.

18. The circuit according to claim 17 wherein said detection circuit generates an error detection signal when said data bit is not fetched within said predetermined period of time.

19. The circuit according to claim 18 further comprising:

a failed address queue connected to said detection circuit, said failed address queue for storing at least a failed memory address in response to an error detection signal generated when said data bit is not fetched within said predetermined time.

20. The circuit according to claim 17 wherein said detection circuit also determines whether said at least one data bit has an expected value of a predefined logic level.

21. The circuit according to claim 19 wherein said detection circuit generates an error detection signal when said at least one data bit has value other than said predefined logic level.

22. The circuit according to claim 17 further comprising:

a reference circuit to generate a reference signal in response to a first control signal; and said detection circuit determines whether said at least one data bit is fetched within a predetermined period of time measured by said reference signal.

23. The circuit according to claim 22 wherein said detection circuit generates an error detection signal when said data bit is not fetched within said predetermined period of time measured by said reference signal.

24. The circuit according to claim 23 wherein said predetermined period of time measured by said reference signal is a time prior to the arrival of said reference signal.

25. The circuit according to claim 22 wherein said detection circuit also determines whether said at least one data bit has an expected value of a predefined logic level measured by said reference signal.

26. The circuit according to claim 25 wherein said detection circuit generates an error detection signal when said at least one data bit has value other than said predefined logic level measured by said reference signal.

27. The circuit according to claim 22 wherein said reference circuit comprises:

a reference memory cell; and a first delay circuit connected to said reference memory cell and said detection circuit, said first delay circuit receiving data from said reference memory cell and transmitting said reference signal to said detection circuit a predetermined time after receipt of said data from said reference memory cell.

28. The circuit according to claim 27 wherein said predetermined delay is a time slightly less than a maximum allowable performance time of said memory array.

29. The circuit according to claim 27 wherein said predetermined delay is a time equal to a maximum allowable performance time of said memory array.

30. The circuit according to claim 22 wherein said detection circuit comprises:
- a detection control circuit responsive to a first control signal to generate a second control signal; and
- a detection logic circuit for generating said detection signal, said detection logic circuit being responsive to said second control signal, said detection logic circuit being connected to said data signal and said reference signal.

31. The circuit according to claim 30 wherein said detection circuit further comprises:
- a pre-processing circuit connected to said memory array and said detection logic circuit, said pre-processing circuit combining a plurality of data bits read from said memory array to generate said data signal, said pre-processing circuit transmitting said data signal to said detection logic circuit.

32. The circuit according to claim 22 further comprising:
a failed address queue connected to said detection circuit, said failed address queue for storing at least a failed memory address in response to an error detection signal generated when said data bit is not fetched within said predetermined time.

33. A computer system comprising:
a memory circuit, said memory circuit comprising:
- a memory array; and
- a detection circuit including logic circuitry connected to receive a data signal representing at least one data bit fetched from said memory array, said detection circuit determines whether said at least one data bit is fetched within a predetermined period of time.

34. The computer system according to claim 33 wherein said detection circuit generates an error detection signal when said data bit is not fetched within said predetermined period of time.

35. The computer system according to claim 34 wherein said memory circuit further comprises:
- a failed address queue connected to said detection circuit, said failed address queue for storing at least a failed memory address in response to an error detection signal generated when said data bit is not fetched within said predetermined time.

36. The computer system according to claim 33 wherein said detection circuit also determines whether said at least one data bit has an expected value of a predefined logic level.

37. The computer system according to claim 36 wherein said detection circuit generates an error detection signal when said at least one data bit has value other than said predefined logic level.

38. The computer system according to claim 33 wherein said memory circuit further comprises:
- a reference circuit to generate a reference signal in response to a first control signal; and
- said detection circuit determines whether said at least one data bit is fetched within a predetermined period of time measured by said reference signal.

39. The computer system according to claim 38 wherein said detection circuit generates an error detection signal when said data bit is not fetched within said predetermined period of time measured by said reference signal.

40. The computer system according to claim 39 wherein said predetermined period of time measured by said reference signal is a time prior to the arrival of said reference signal.

41. The computer system according to claim 39 wherein said detection circuit comprises:
- a detection control circuit responsive to a first control signal to generate a second control signal; and
- a detection logic circuit for generating said detection signal, said detection logic circuit being responsive to said second control signal, said detection logic circuit being connected to said data signal and said reference signal.

42. The computer system according to claim 41 wherein said detection circuit further comprises:
- a pre-processing circuit connected to said memory array and said detection logic circuit, said pre-processing circuit combining a plurality of data bits read from said memory array to generate said data signal, said pre-processing circuit transmitting said data signal to said detection logic circuit.

43. The computer system according to claim 38 wherein said detection circuit also determines whether said at least one data bit has an expected value of a predefined logic level measured by said reference signal.

44. The computer system according to claim 43 wherein said detection circuit generates an error detection signal when said at least one data bit has value other than said predefined logic level measured by said reference signal.

45. The computer system according to claim 38 wherein said reference circuit comprises:
- a reference memory cell; and
- a first delay circuit connected to said reference memory cell and said detection circuit, said first delay circuit receiving data from said reference memory cell and transmitting said reference signal to said detection circuit a predetermined time after receipt of said data from said reference memory cell.

46. The computer system according to claim 45 wherein said predetermined delay is a time slightly less than a maximum allowable performance time of said memory array.

47. The computer system according to claim 45 wherein said predetermined delay is equal to a maximum allowable performance time of said memory array.

48. The computer system according to claim 38 wherein said memory circuit further comprises:
- a failed address queue connected to said detection circuit, said failed address queue for storing at least a failed memory address in response to an error detection signal generated when said data bit is not fetched within said predetermined time.

49. A method of testing a memory array comprising the steps of:
- accessing the memory array using a row address and a column address;
- fetching at least one data bit from the accessed memory;
- determining whether said at least one data bit was fetched within a predetermined period of time.

50. The method according to claim 49 further comprising the step of generating an error detection signal when said at least one data bit is not fetched within said predetermined period of time.

51. The method according to claim 50 further comprising the storing of the row address and column address of the accessed memory in response to an error detection signal generated when said at least one data bit was not fetched within said predetermined period of time.

52. The method according to claim 50 further comprising the storing of a number of error detection signals generated when said at least one data bit was not fetched within said predetermined period of time.

53. The method according to claim 49 further comprising the step of determining whether said at least one data bit has an expected value of a predefined logic level.

54. The method according to claim 53 further comprising the step of generating an error detection signal when said at least one data bit has a value other than said predefined logic level.

55. The method according to claim 49 wherein said predetermined period of time is measured by a reference signal.

56. The method according to claim 55 further comprising the step of generating an error detection signal when said at least one data bit is not fetched within said predetermined period of time measured by said reference signal.

57. The method according to claim 56 wherein said predetermined period of time measured by said reference signal is a time prior to an arrival of said reference signal.

58. The method according to claim 56 further comprising the storing of the row address and column address of the accessed memory in response to an error detection signal generated when said at least one data bit was not fetched within said predetermined period of time measured by said reference signal.

59. The method according to claim 56 further comprising the storing of a number of error detection signals generated when said at least one data bit was not fetched within said predetermined period of time measured by said reference signal.

60. The method according to claim 55 further comprising the step of determining whether said at least one data bit has an expected value of a predefined logic level measured by said reference signal.

61. The method according to claim 60 further comprising the step of generating an error detection signal when said at least one data bit has a value other than said predefined logic level measured by said reference signal.

62. The method according to claim 55 wherein said reference signal is generated by a reference circuit.

63. A method of manufacturing a semiconductor circuit comprising the steps of:

providing a memory array on a semiconductor device;

providing a detection circuit on the semiconductor device; and connecting said detection circuit to said memory array such that an error detection signal is generated when fetched data bits from said memory array are not fetched within a predetermined period of time.

64. The method according to claim 63 further comprising:

providing a reference circuit for generating a reference signal in which said predetermined period of time is to be measured against.

65. The method according to claim 64 wherein the step of providing said reference circuit comprises:

providing a reference memory cell; and providing a delay circuit connected to said reference memory cell and said detection circuit.

66. The method according to claim 65 wherein the step of providing a detection circuit comprises:

providing a detection control circuit; and providing a detection logic circuit connected to said detection control circuit, said reference signal and said memory array.

67. The method according to claim 66 further comprising providing a pre-processing circuit connected to said memory array and said detection logic circuit.

68. The method according to claim 63 further comprising the step of providing a failed address queue connected to said detection circuit for storing at least the address of a failed memory cell in response to said error detection signal.

* * * * *

UNITED STATES PATENT AND TRADEMARK OFFICE
CERTIFICATE OF CORRECTION

PATENT NO. : 6,119,251

DATED : September 12, 2000

INVENTOR(S) : Eugene H. Cloud et al.

It is certified that error appears in the above-identified patent and that said Letters Patent is hereby corrected as shown below:

COLUMN 2:

Line 59, "D-AM" should read --DRAM--.

COLUMN 14:

Line 46, reads "well. while the invention has been described in detail in", but should read --well.--.

Line 47, please insert --While the invention has been described in detail in-- before "connection".

Signed and Sealed this

First Day of May, 2001

NICHOLAS P. GODICI

Attest:

Attesting Officer

Acting Director of the United States Patent and Trademark Office